United States Patent
Mori et al.

(10) Patent No.: US 6,834,021 B2
(45) Date of Patent: Dec. 21, 2004

(54) SEMICONDUCTOR MEMORY HAVING MEMORY CELLS REQUIRING REFRESH OPERATION

(75) Inventors: Kaoru Mori, Kawasaki (JP); Shinichi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 13 days.

(21) Appl. No.: 10/350,191

(22) Filed: Jan. 24, 2003

(65) Prior Publication Data

US 2004/0017720 A1 Jan. 29, 2004

(30) Foreign Application Priority Data

Jul. 25, 2002 (JP) ......................................... 2002-216132

(51) Int. Cl.[7] .............................................. G11C 7/00
(52) U.S. Cl. .................... 365/222; 365/230.03
(58) Field of Search ............................ 365/222, 230.03

(56) References Cited

U.S. PATENT DOCUMENTS 5,262,998 A * 11/1993 Mnich et al. ............... 365/222
5,748,547 A * 5/1998 Shau ........................... 365/222
5,875,132 A * 2/1999 Ozaki ..................... 365/189.03
6,208,577 B1 * 3/2001 Mullarkey ................... 365/222

* cited by examiner

Primary Examiner—M. Tran
(74) Attorney, Agent, or Firm—Arent Fox PLLC

(57) ABSTRACT

An operation control circuit sets an inactivating timing of sense amplifiers activated in response to a read request, a write request, or a refresh request, to the timing a maximum possible quantity of signals which can be output from the sense amplifiers operating in response to the refresh request is transmitted to memory cells. Tailoring the activating period of the sense amplifiers to a refresh operation can reduce access time. A refresh control circuit generates a predetermined number of refresh requests consecutively to refresh all of the memory cells before extending the cycle of generating refresh requests. When refresh requests occur consecutively, the refresh frequency can be lowered to reduce power consumption. As a result, access time can be reduced without increasing power consumption during the standby mode.

19 Claims, 24 Drawing Sheets

SEMICONDUCTOR MEMORY HAVING MEMORY CELLS REQUIRING REFRESH OPERATION

BACKGROUND OF THE INVENTION

1. Field of the Invention

The present invention relates to a semiconductor memory which requires refresh operations to retain data written in its memory cells.

2. Description of the Related Art

Such semiconductor memories as a DRAM having dynamic memory cells need to perform refresh operations with a predetermined cycle in order to retain data in their memory cells. The frequency of refresh operations may be reduced by increasing signal quantities (charges) written in the memory cells. Hence, the greater the signals quantities to be written to the memory cells are, the longer the data retention time is and the lower the power consumption is. On the other hand, at the time of rewriting data during read operations and in write operations, writing greater quantities of signals to the memory cells lead to extending the operating time (cycle time).

As mentioned above, securing the data retention time and reducing the cycle time are goals which coincide with each other. Thus, it has been difficult for semiconductor memories such as a DRAM to achieve both securing data retention time and reducing cycle time at the same time.

Conventionally, in semiconductor memories that are oriented to low power consumption, signal quantities to be written to the memory cells are increased to lower the refresh frequency in exchange for extended cycle time. In semiconductor memories oriented to high-speed access, signal quantities to be written to the memory cells are not increased, and the cycle time is reduced in return for higher refresh frequency.

SUMMARY OF THE INVENTION

It is an object of the present invention to reduce the cycle time of a semiconductor memory having dynamic memory cells without increasing the power consumption.

According to one of the aspects of the semiconductor memory of the present invention, an operation control circuit activates sense amplifiers in response to a read request, a write request, and a refresh request to memory cells. The sense amplifiers amplify quantity of signals in data to be written to the memory cells. The memory cells require refresh to retain data. The operation control circuit also sets timing of the sense amplifiers inactivates to correspond to a timing a maximum possible quantity of signals, which is amplified by the sense amplifiers operating in response to the refresh request, is transmitted to the memory cells. Consequently, in a refresh operation corresponding to the refresh request, data read from the memory cells is fully written to the memory cells again. In a read operation corresponding to the read request and a write operation corresponding to the write request, data is not fully written to the memory cells. Tailoring the activating period of the sense amplifiers to the refresh operating time, however, allows reduction in the read operating time and the write operating time.

A refresh control circuit cyclically outputs a refresh request signal as the refresh request for refreshing the memory cells. The refresh control circuit extends the cycle of generating the refresh request signal after a predetermined number of refresh requests are generated consecutively without intervention of the read request or the write request so that the memory cells are all refreshed. When the refresh requests occur consecutively (standby mode), the refresh frequency can thus be lowered to reduce power consumption. As a result, the cycle time can be reduced without increasing the power consumption in the standby mode.

According to another aspect of the semiconductor memory of the present invention, the refresh control circuit includes a consecutive refresh judgement circuit and a refresh timer. The consecutive refresh judgement circuit activates a cycle changing signal when a refresh address counter, for generating a refresh address designating a memory cell to refresh, goes through a single round without the intervention of the read request or the write request to the memory cells. The refresh timer extends a length of the cycle for generating the refresh request signal while the cycle changing signal is activated, so that the cycle is longer than the length of a cycle while the cycle changing signal is inactivated. The time of the cycle can thus be reduced by a simple logic circuit, without increasing the power consumption during the standby mode.

According to another aspect of the semiconductor memory of the present invention, the cycle changing signal output from the consecutive refresh judgement circuit is output to the exterior through an external terminal. In accordance with the cycle changing signal, the cycle for supplying an external refresh request can be extended so that a semiconductor memory capable of being supplied with the refresh request even from the exterior is reduced in cycle time without increasing power consumption during the standby mode.

According to another aspect of the semiconductor memory of the present invention, the refresh control circuit includes a refresh counter and a refresh timer. The refresh counter is reset in accordance with the read request signal or the write request to the memory cells, and counts in accordance with the refresh request signal. The refresh counter activates a cycle changing signal when its counter value reaches a predetermined number. The refresh timer extends the length of the cycle for generating the refresh request signal while the cycle changing signal is activated, so that the cycle is longer than the length of a cycle while the cycle changing signal is inactivated. The cycle time can thus be reduced by a simple logic circuit without any increase in power consumption in the standby mode.

According to another aspect of the semiconductor memory of the present invention, a plurality of word lines are connected to the memory cells, respectively. One of the word lines is selected in accordance with an address signal. The operation control circuit sets selecting periods for the word lines to be equal, in a read operation corresponding to the read request, a write operation corresponding to the write request, and a refresh operation corresponding to the refresh request. Since the selecting period of the word lines need not be changed depending on the type of operation, the operation control circuit can be configured simply.

According to another aspect of the semiconductor memory of the present invention, the refresh request is recognized only by the refresh request signal output from the refresh control circuit. A refresh operation is performed on the memory cells only in response to the refresh request signal, without receiving a command signal from an external terminal. That is, a semiconductor memory capable of performing a refresh operation automatically in the inside can be reduced its cycle time without any increase in power consumption in the standby mode.

According to another aspect of the semiconductor memory of the present invention, a plurality of word lines are connected to the memory cells, respectively. One of the word lines is selected in accordance with an address signal. The operation control circuit sets a selecting period of the word lines in at least one of a read operation corresponding to the read request or a write operation corresponding to the write request, to be shorter than the selecting period for the word lines in a refresh operation corresponding to the refresh request. Consequently, the cycle time can be further reduced without any increase in power consumption in the standby mode.

According to another aspect of the semiconductor memory of the present invention, the operation control circuit sets a timing for the word lines to be deselected during at least either of the read operation and the write operation at earlier than the deselecting timing of the word lines in the refresh operation. Consequently, in the cycle time can be further educed without any increase the power consumption in standby mode.

According to another aspect of the semiconductor memory of the present invention, the operation control circuit sets an activating period of the sense amplifiers in at least either of a read operation corresponding to the read request and a write operation corresponding to the write request at shorter than the activating period of the sense amplifiers in a refresh operation on the memory cells. Consequently, the cycle time can be further reduced with no increase in the power consumption in standby mode.

According to another aspect of the semiconductor memory of the present invention, the operation control circuit recognizes the refresh request when the refresh request signal is output from the refresh control circuit or a refresh command is supplied through an external terminal. That is, in a semiconductor memory which automatically performs refresh operations inside as well as in response to refresh requests from the exterior, the cycle time can be reduced without any increase of power consumption in the standby mode.

According to another aspect of the semiconductor memory of the present invention, the operation control circuit outputs a sense amplifier activating signal for activating the sense amplifiers in response to the read request, the write request, and the refresh request. The sense amplifiers are connected to a power supply line in response to the sense amplifier activating signal. The maximum possible quantity of signals to be amplified by the sense amplifiers is a quantity corresponding to a power supply voltage of the power supply line. Through the sense amplifiers, signal quantities to be written to the memory cells are brought into correspondence with the power supply voltage. After the start of operation of the sense amplifiers, data can thus be written to the memory cells at high speed. As a result, the refresh operation, the read operation, and the write operation can be performed at high speed.

BRIEF DESCRIPTION OF THE DRAWINGS

The nature, principle, and utility of the invention will become apparent from the following detailed description when read in conjunction with the accompanying drawings in which like parts are designated by identical reference numbers, in which.

DESCRIPTION OF THE PREFERRED EMBODIMENTS

Figure 1:
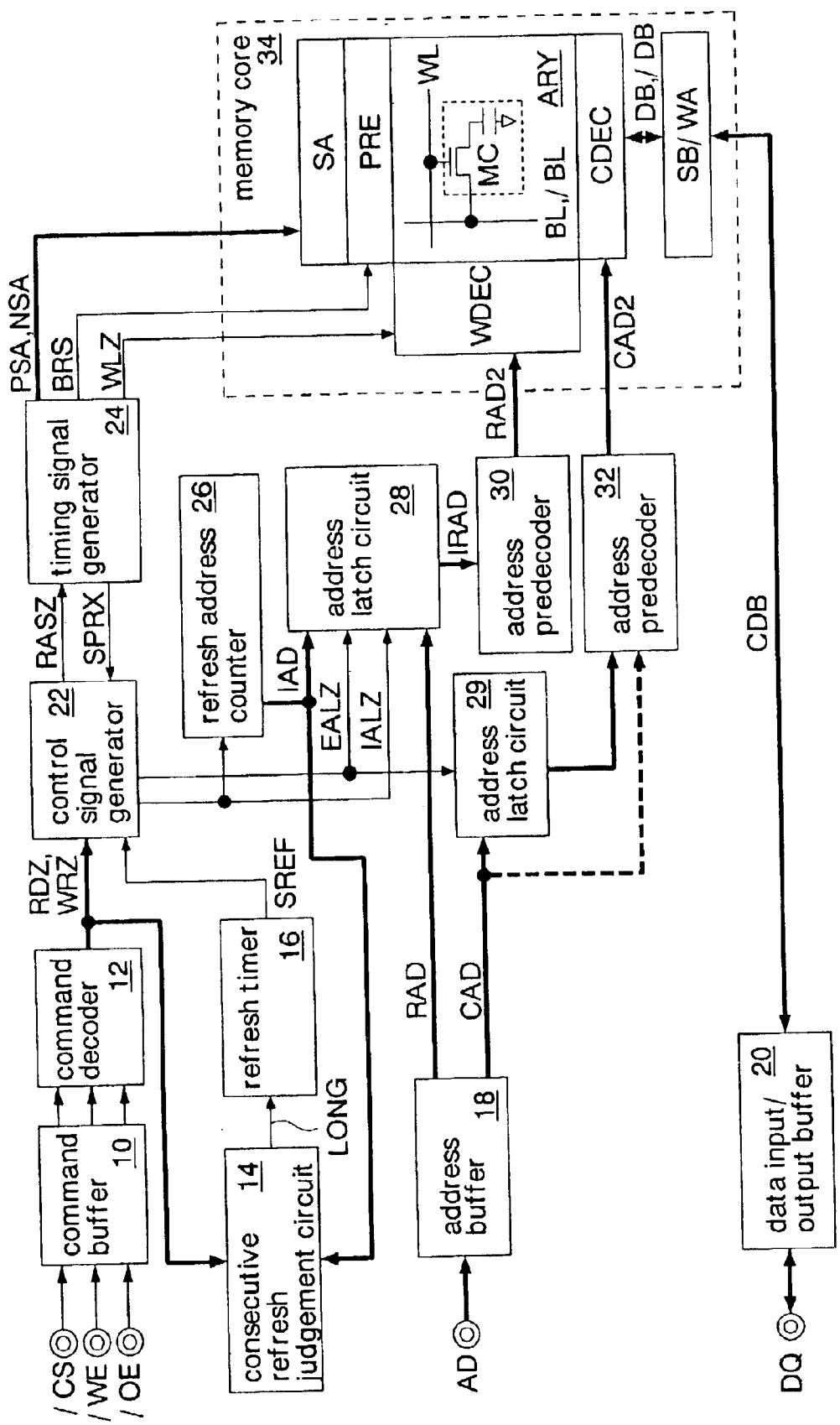
FIG. 1 is a block diagram showing a first embodiment of the semiconductor memory of the present invention.

Hereinafter, embodiments of the present invention will be described with reference to the drawings. In the drawings, each thick line represents a signal line that consists of a plurality of lines. Signals ending in "Z" are of positive logic. Signals with a leading "/" and signals ending in "X" are of negative logic. Double circles in the drawings represent external terminals. In the following description, signal names may be abbreviated like a "/CS signal" for a "chip select signal".

FIG. 1 shows a first embodiment of the semiconductor memory of the present invention. This semiconductor memory is formed as a pseudo SRAM, which has DRAM memory cells and an SRAM interface, by using CMOS technology. The pseudo SRAM performs refresh operations within the chip at regular time intervals without receiving a refresh command from the exterior, thereby retaining data written in its memory cells. This pseudo SRAM is used for a work memory to be implemented on a cellular phone, for example.

The pseudo SRAM comprises a command buffer 10, a command decoder 12, a consecutive refresh judgement circuit 14, a refresh timer 16, an address buffer 18, a data input/output buffer 20, a control signal generator 22, a timing signal generator 24, a refresh address counter 26, address latch circuits 28 and 29, address predecoders 30 and 32, and a memory core 34.

The command buffer 10 receives command signals (a chip select signal /CS, a write enable signal /WE, and an output enable signal /OE) from the exterior. The command decoder 12 decodes the command signals supplied from the command buffer 10, and outputs a read control signal RDZ or a write control signal WRZ.

The consecutive refresh judgement circuit 14 has two cascaded latches, for example. The consecutive refresh judgement circuit 14 activates (changes to high level) a cycle changing signal LONG when the refresh address counter 26 goes through a single round without the intervention of the read control signal RDZ (read request) or the write control signal WRZ (write request). More specifically, a single round of the refresh address counter 26 is detected when a refresh address IAD="0" is received twice without the intervention of the read control signal RDZ (read request) or the write control signal WRZ (write request). Then, after the activation of the cycle changing signal LONG, the consecutive refresh judgement circuit 14 inactivates (changes to low level) the cycle changing signal LONG when a new read command (read request) or write command (write request) is supplied.

The read command is recognized when the /CS signal and /OE signal of low level and the /WE signal of high level are supplied. The write command is recognized when the /CS signal and /WE signal of low level and the /OE signal of high level are supplied. Since the semiconductor memory of this embodiment is a pseudo SRAM, no refresh command is supplied from the exterior.

The refresh timer 16 outputs a refresh request signal SREF (a refresh request, an internal refresh command) in predetermined cycles. The refresh timer 16 outputs the refresh request signal SREF with a cycle CYC1 shown in FIG. 7 to be seen later when the cycle changing signal LONG is at low level. When the cycle changing signal LONG is at high level, the refresh timer 16 outputs the refresh request signal SREF with a cycle CYC2 which is longer than the cycle CYC1.

The consecutive refresh judgement circuit 14 and the refresh timer 16 operate as a refresh control circuit for extending the cycle of generating the refresh request signal SREF when a predetermined number of refresh request signals SREF are generated consecutively without the intervention of the read request or the write request.

The address buffer 18 receives an address signal AD through an address terminal, and outputs the received signal as a row address signal RAD (upper address) and a column address signal CAD (lower address). That is, this pseudo SRAM is a memory of address non-multiplex type which receives the upper address and the lower address simultaneously.

The data input/output buffer 20 receives read data through a common data bus CDB and outputs the received data to a data terminal DQ. The data input/output buffer 20 receives write data through the data terminal DQ and outputs the received data to the common data bus CDB. The number of bits of the data terminal DQ is 16 bits, for example.

The control signal generator 22 receives the read control signal RDZ, the write control signal WRZ, and the refresh request signal SREF, and activates a row operation control signal RASZ so that any of read, write, and refresh operations are performed in order of the reception. The control signal generator 22 inactivates the row operation control signal RASZ in response to a reset signal SPRX from the timing signal generator 24. In performing a read operation corresponding to the read command or a write operation corresponding to the write command, the control signal generator 22 outputs an external address latch signal EALZ. In performing a refresh operation corresponding to the refresh request signal SREF, it outputs an internal address latch signal IALZ.

When the control signal generator 22 receives the refresh request signal SREF in advance of the read control signal RDZ or write control signal WRZ, it outputs the row operation control signal RASZ and internal address latch signal IALZ corresponding to the SREF signal before outputting the row operation control signal RASZ and external address latch signal EALZ corresponding to the RDZ signal or WRZ signal. The row operation control signal RASZ and internal address latch signal IALZ corresponding to the refresh request signal SREF function as refresh control signals for controlling a refresh operation.

When the control signal generator 22 receives the refresh request signal SREF after the RDZ signal or WRZ signal, it outputs the row operation control signal RASZ and external address latch signal EALZ corresponding to the RDZ signal or WRZ signal before outputting the row operation control signal RASZ and internal address latch signal IALZ corresponding to the SREF signal. That is, the control signal generator 22 operates as an arbiter for setting priorities between read/write operations and a refresh operation.

In response to the row operation control signal RASZ (a read request, a write request, and a refresh request), the timing signal generator 24 outputs sense amplifier activating signals PSA and NSA for operating sense amplifiers SA, a bit line reset signal BRS for controlling a precharge operation of bit lines BL and /BL, and a word line control signal WLZ for operating a word decoder WDEC. The control signal generator 22 and the timing signal generator 24 operate as an operation control circuit for performing read, write, and refresh operations.

The refresh address counter 26 counts in synchronization with the rising edges of the internal address latch signal IALZ, thereby incrementing an internal address IAD by "1". The number of bits of the refresh address counter 26 is the same as that of the row address signal RAD to be supplied to the address terminal AD.

The address latch circuit 28 latches the row address RAD in synchronization with the external address latch signal EALZ, or latches the internal address signal IAD in synchronization with the internal address latch signal IALZ. The address latch circuit 28 outputs the latched signal as an internal row address signal IRAD.

The address latch circuit 29 latches the column address signal CAD in synchronization with the external address latch signal EALZ and outputs the latched address to the address predecoder 32. The column address signal CAD is supplied directly to the address predecoder 32 without going through the address latch circuit 29, during the page mode in which the memory cells MC connected to an word line WL is continuously accessed (shown in dotted lines in the drawing).

The address predecoder 30 predecodes the internal row address signal IRAD and outputs the decoded signal as a row address signal RAD2. The address predecoder 32 predecodes the column address signal CAD and outputs the decoded signal as a column address signal CAD2.

The memory core 34 includes a memory cell array ARY, a word decoder WDEC, sense amplifiers SA, precharging circuits PRE, a column decoder CDEC, a sense buffer SB, and a write amplifier WA. The memory cell array ARY has a plurality of volatile memory cells MC (dynamic memory cells), along with a plurality of word lines WL and a plurality of bit lines BL, /BL (complementary bit lines) connected to the memory cells MC.

The memory cells MC are identical to typical DRAM memory cells, each having a capacitor for retaining data in the form of a charge and a transfer transistor arranged between this capacitor and a bit line BL. The memory cells MC require refresh operations (or read operations) at regular time intervals for the sake of data retention.

The gates of the transfer transistors are connected to the word lines WL. Through the selection of the word lines WL, any of a read operation, a write operation, and a refresh operation is performed. The memory cell array ARY performs any of the read operation, write operation, and refresh operation before executing a precharge operation for resetting the bit lines BL to a predetermined voltage in response to a change of the bit line reset signal BRS to high level.

The sense amplifiers SA amplify the signal quantities of data on the bit lines BL. In a read operation, the data read from the memory cells MC, amplified by the sense amplifiers SA is transmitted to the data bus DB, /DB through column switches CSW. At the same time, the data is rewritten to the memory cells MC. In a write operation, the data supplied from the exterior, amplified by the sense amplifiers SA is written to the memory cells MC through the bit lines BL and /BL. In a refresh operation, the data read from the memory cells MC, amplified by the sense amplifiers SA is rewritten to the memory cells MC without being output to the exterior. The precharging circuits PRE perform a precharge operation for resetting the bit lines BL to the predetermined voltage in response to the change of the bit line reset signal BRS to high level.

The word decoder WDEC, when receiving the word line control signal WLZ of high level, selects any of the word lines WL according to the row address signal RAD2 and boosts the selected word line WL to a boost voltage which is higher than the power supply voltage. Since the word lines WL are boosted by using typical technology, the booster circuit for generating the boost voltage is not shown in particular.

In accordance with the column address signal CAD2, the column decoder CDEC outputs a column line signal (CLZ in FIG. 3 to be seen later) for turning on the column switches (CSW in FIG. 3 to be seen later) that connect the bit lines BL, /BL and the data bus DB, /DB, respectively.

The sense buffer SB amplifies the read data on the data bus DB, /DB in signal quantity, and outputs the resultant to the common data bus CDB. The write amplifier WA amplifies the write data on the common data bus CDB in signal quantity, and outputs the resultant to the data bus DE, /DB.

Figure 2:
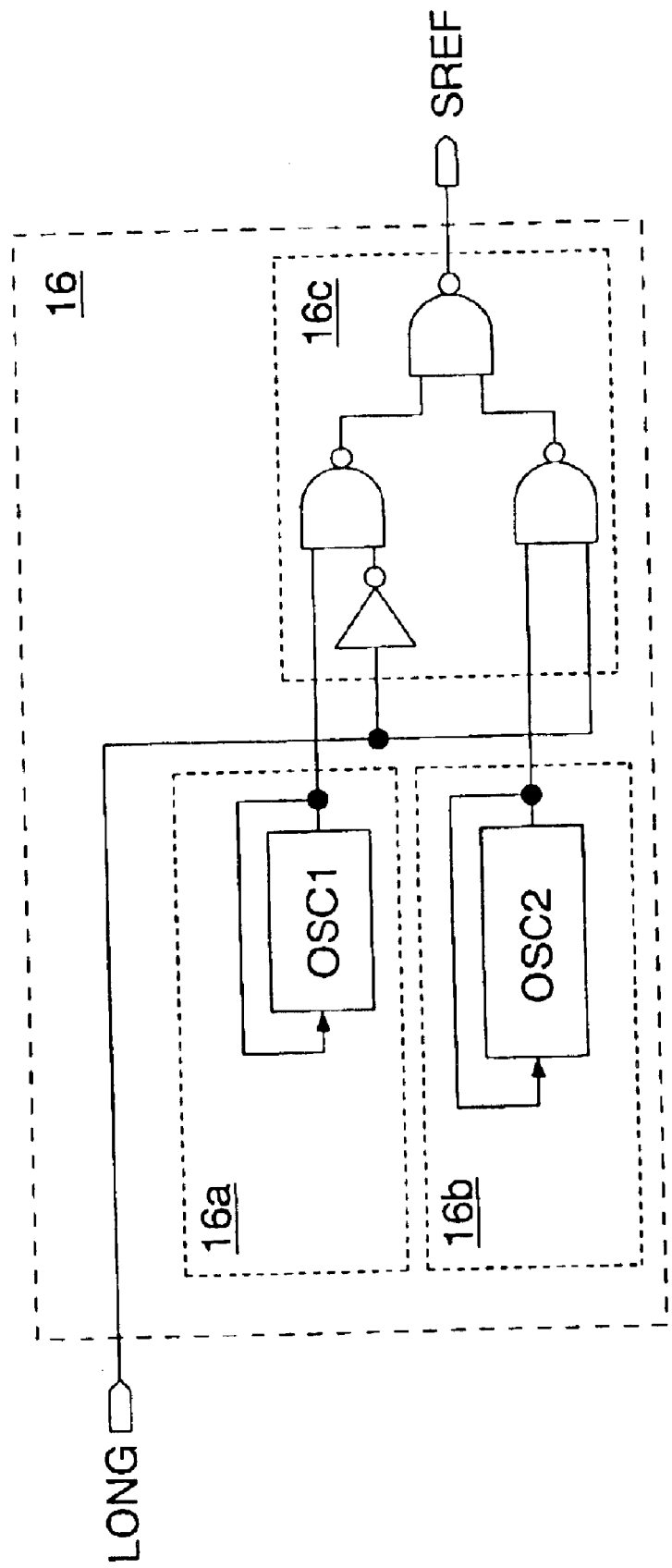
FIG. 2 is a block diagram showing the details of the refresh timer shown in FIG. 1.

FIG. 2 shows the details of the refresh timer 16 shown in FIG. 1.

The refresh timer 16 comprises an oscillating circuit 16a which consists of an oscillator OSC1, an oscillating circuit 16b which consists of an oscillator OSC2 having an oscillation cycle longer than that of the oscillator OSC1, and a selector 16c which selects the outputs of the oscillating circuits 16a and 16b according to the cycle changing signal LONG and outputs the resultant as the refresh request signal SREF. The refresh timer 16 outputs the refresh request signal SREF having the oscillation cycle of the oscillator OSC1 while the cycle changing signal LONG is at low level. The refresh timer 16 outputs the refresh request signal SREF having the oscillation cycle of the oscillator OSC2 while the cycle changing signal LONG is at high level. Although not shown in particular, the refresh timer 16 contains a circuit for preventing the refresh request signal SREF from suffering a hazard when the cycle changing signal LONG changes.

Figure 3:
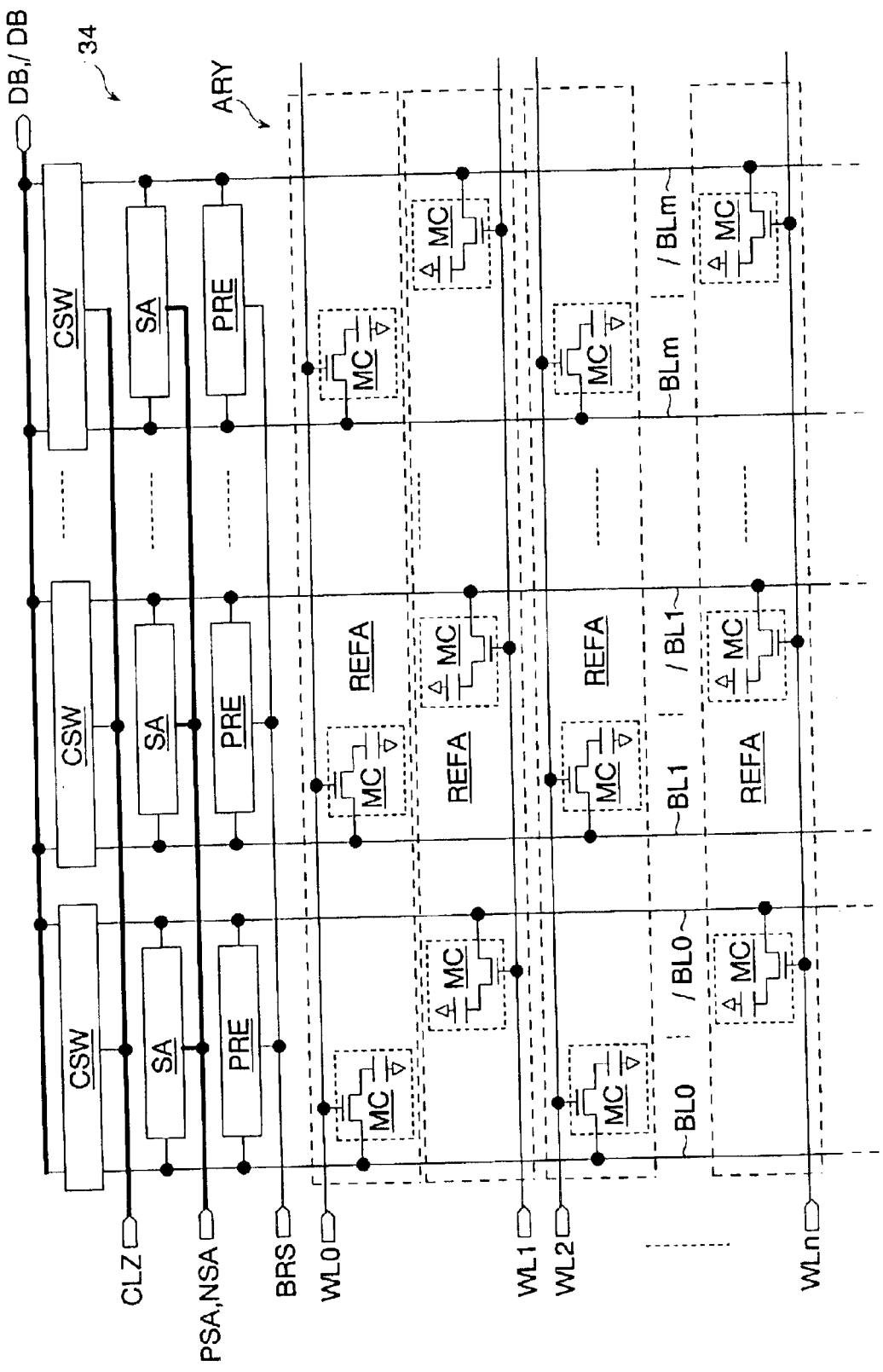
FIG. 3 is a block diagram showing the details of the memory core shown in FIG. 1.

FIG. 3 shows the details of the memory core 34 shown in FIG. 1.

The memory cell array ARY comprises the memory cells MC arranged in a matrix, the plurality of word lines WL (WL0, WL1, . . . , WLn) connected to the memory cells MC, and the plurality of bit lines BL, /BL (BL0, /BL0, BL1, /BL1, . . . , BLm, /BLm) connected to the memory cells MC. The memory cells MC connected to each single word line WL constitute a single refresh unit, or a refresh area REFA. That is, the number of word lines WL is equal to the number of refresh areas REFA. The number of word lines WL and the number of refresh areas REFA are both n.

The sense amplifiers SA are each connected to the signal lines of the sense amplifier activating signals PSA, NSA and complementary bit lines BL, /BL. The precharging circuits PRE are each connected to the signal line of the bit line control signal BRS and complementary bit lines BL, /BL. The column switches CSW are each connected to complementary bit lines BL and /BL. Receiving the column line signal CLZ of high level, the column switches CSW turn on to connect the bit lines BL, /BL and the data bus DB, /DB, respectively.

Figure 4:
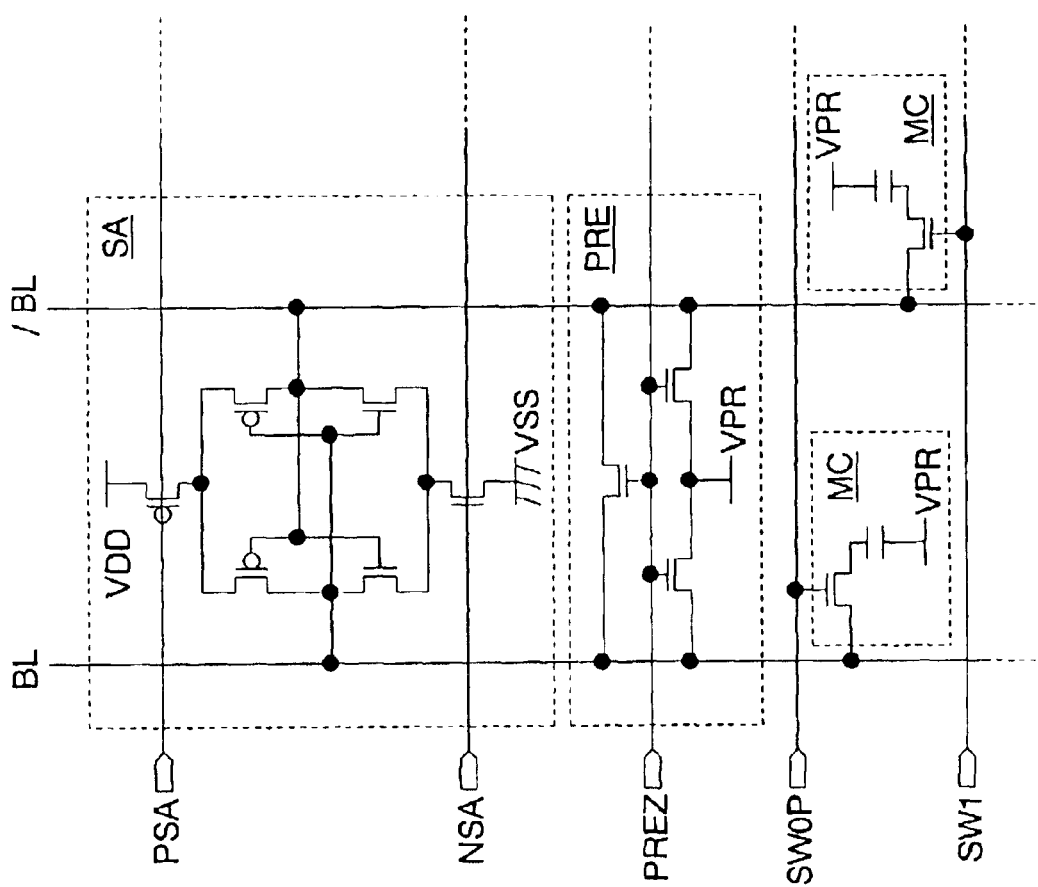
FIG. 4 is a circuit diagram showing the details of the sense amplifiers and precharging circuits shown in FIG. 3.

FIG. 4 shows the details of the sense amplifiers SA and the precharging circuits PRE shown in FIG. 3.

A sense amplifier SA comprises two CMOS inverters connected to each other at their inputs and outputs, a PMOS transistor (pMOS switch) for connecting the sources of the pMOS transistors of the CMOS inverters to a power supply line VDD (a high-level-side power supply line), and an nMOS transistor (nMOS switch) for connecting the sources of the nMOS transistors of the CMOS inverters to a ground line VSS (a low-level-side power supply line). The inputs (or outputs) of the CMOS inverters are connected to the bit lines BL and /BL, respectively.

The pMOS switch turns on when the sense amplifier activating signal PSA is at low level, thereby connecting the CMOS inverters to the power supply line VDD. The nMOS switch turns on when the sense amplifier activating signal NSA is at high level, thereby connecting the CMOS inverters to the ground line VSS. While the pMOS switch and the nMOS switch are on, the CMOS inverters are activated so that a voltage difference between the bit lines BL and /BL is amplified differentially. That is, the sense amplifier SA is connected to the power supply lines VDD and VSS in response to the sense amplifier activating signals PSA and NSA, so that it can amplify the voltages of the bit lines BL and /BL up to the power supply voltage VDD or down to the ground voltage VSS. That is, the maximum possible signal quantity for the sense amplifier SA to amplify corresponds to the power supply voltage VDD and the ground voltage VSS.

The precharging circuit PRE comprises an nMOS transistor for connecting the bit lines BL and /BL to each other, and nMOS transistors for connecting the bit lines BL and /BL to a precharge voltage line VPR, respectively. The nMOS transistors turn on when a precharging signal PREZ is at high level, thereby connecting the bit lines BL and /BL to the precharge voltage line VPR.

Figure 5:
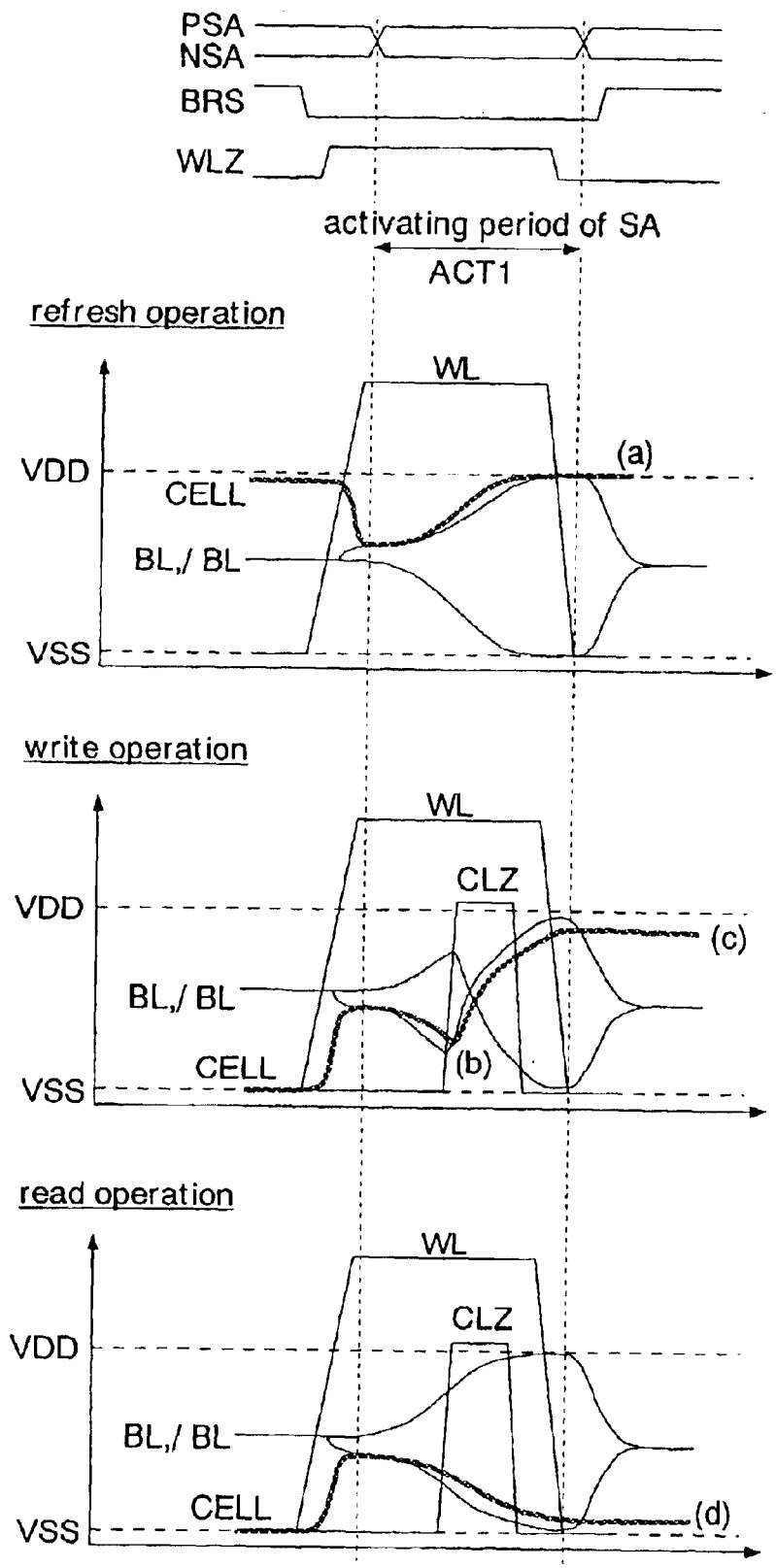
FIG. 5 is a timing chart showing the operation of the memory core in the semiconductor memory of the first embodiment.

FIG. 5 shows the operation of the memory core in the semiconductor memory of the first embodiment.

In this embodiment, the timing signal generator 24 shown in FIG. 1 outputs the sense amplifier activating signals PSA and NSA, the bit line control signal BRS, and the word line control signal WLZ at the respective same timings in the refresh operation, write operation, and read operation. Consequently, the operation period of the sense amplifiers SA and the selecting period of the word lines WL are identical in any of the refresh, write, and read operations.

The activating period ACT1 of the sense amplifier activating signals PSA, NSA, and the activating period of the word line control signal WLZ are set in accordance with the period for the cell voltages CELL (thick lines in the chart) of the memory cells MC to reach the power supply voltage VDD or the ground voltage VSS in a refresh operation. In other words, the inactivating timing of the sense amplifiers SA is set in accordance with timing for the maximum possible signal quantity (the power supply voltage VDD or the ground voltage VSS) output from the sense amplifiers SA operating in response to a refresh request is transmitted to the memory cells MC. Here, the cell voltages CELL refer to the voltages of the nodes that connect the transfer transistors and the capacitors in the respective memory cells MC.

In a refresh operation, the data rewriting operation changes the cell voltages CELL to the power supply voltage VDD or the ground voltage VSS (FIG. 5(a)). That is, data read from the memory cells MC to the bit lines BL (or /BL) is fully written to the memory cells MC.

In a write operation, the worst timing is for situations where data inverted in logic from that retained in the memory cells MC is to be written. In this case, the original data that starts being amplified by the sense amplifiers SA must be inverted (FIG. 5(b)). The data of inverted logic is supplied through the data bus DB, /DB when the column line signal CLZ is at high level. Since the write operation may require the data inverting operation, the period available for writing data to the memory cells MC becomes shorter. It is therefore impossible to change the cell voltages CELL up to the power supply voltage VDD or down to the ground voltage VSS within the activating period ACT1 (FIG. 5(c)). The voltages are, however, sufficient for data retention.

In a read operation, the data amplified by the sense amplifiers SA is output to the data bus DB, /DB through the column switches CSW. The bit lines BL, /BL are connected to the data bus DB, /DB while the column line signal CLZ is at high level. Here, the bit lines BL, /BL vary in voltage under the influence of the data bus DB, /DB. Consequently, the period for the voltages of the bit lines BL, /BL to reach the power supply voltage VDD or the ground voltage VSS becomes longer than in a refresh operation. In other words, the memory cells MC are rewritten insufficiently as compared to in the refresh operation where the bit lines BL, /BL are not connected to the data bus DB, /DB. As a result, it is impossible to change the cell voltages CELL up to the power supply voltage VDD or down to the ground voltage VSS within the activating period ACT1 (FIG. 5(d)). The voltages are, however, sufficient for data retention.

As shown in FIG. 5, one of the characteristics of this embodiment consists in that the memory cells MC are fully written with data only in the refresh operation. Moreover, the activating period of the sense amplifiers SA, the selecting period of the word lines WL, and the precharge operating timing are rendered identical in any of the refresh, write, and read operations. Tailoring the operation period of the memory core 34 to the refresh operation reduces the write operating time and read operating time (access time). After the write operation and the read operation, the cell voltages CELL are yet to reach the power supply voltage VDD or the ground voltage VSS. Accordingly, as shown in FIG. 7 to be seen later, the cycle of a predetermined number of refresh operations must be shortened in accordance with the cell voltages CELL.

Figure 6:
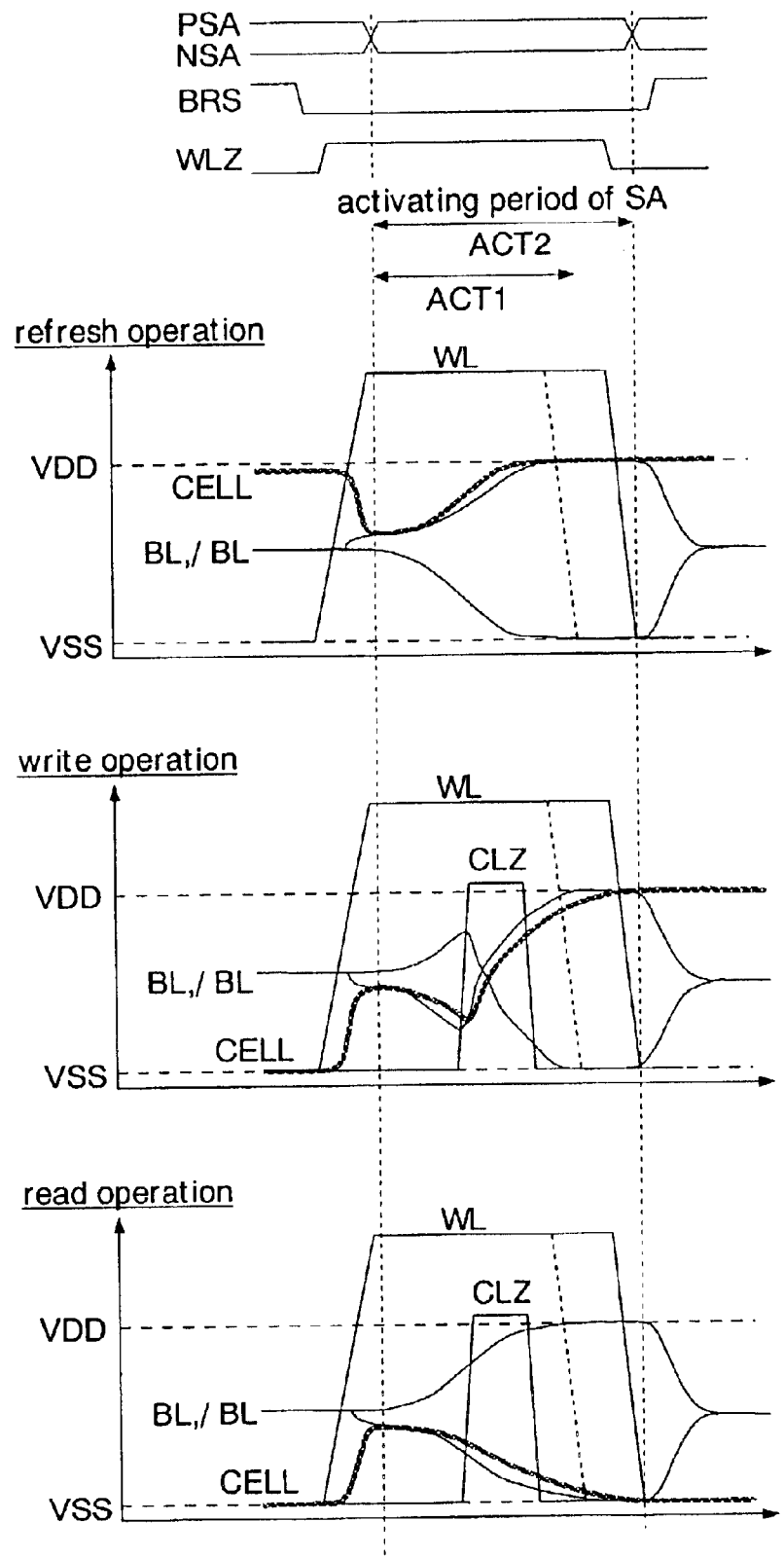
FIG. 6 is a timing chart showing a comparative example of the operation of the memory core.

FIG. 6 shows the operation of a conventional, typical DRAM memory core (comparative example).

In this memory core, the activating period ACT2 of the sense amplifier activating signals PSA and NSA is tailored to the write operation (ACT2>ACT1). The timings of the word line control signal WLZ and the bit line control signal BRS are set in accordance with the sense amplifier activating signals PSA and NSA. Consequently, the cell voltages CELL reach the power supply voltage VDD or the ground voltage VSS in any of the write, read, and refresh operations. In the chart, the broken lines attached to the waveforms of the word lines WL show the inactivating timing of the word lines WL in FIG. 5 seen above.

Figure 7:
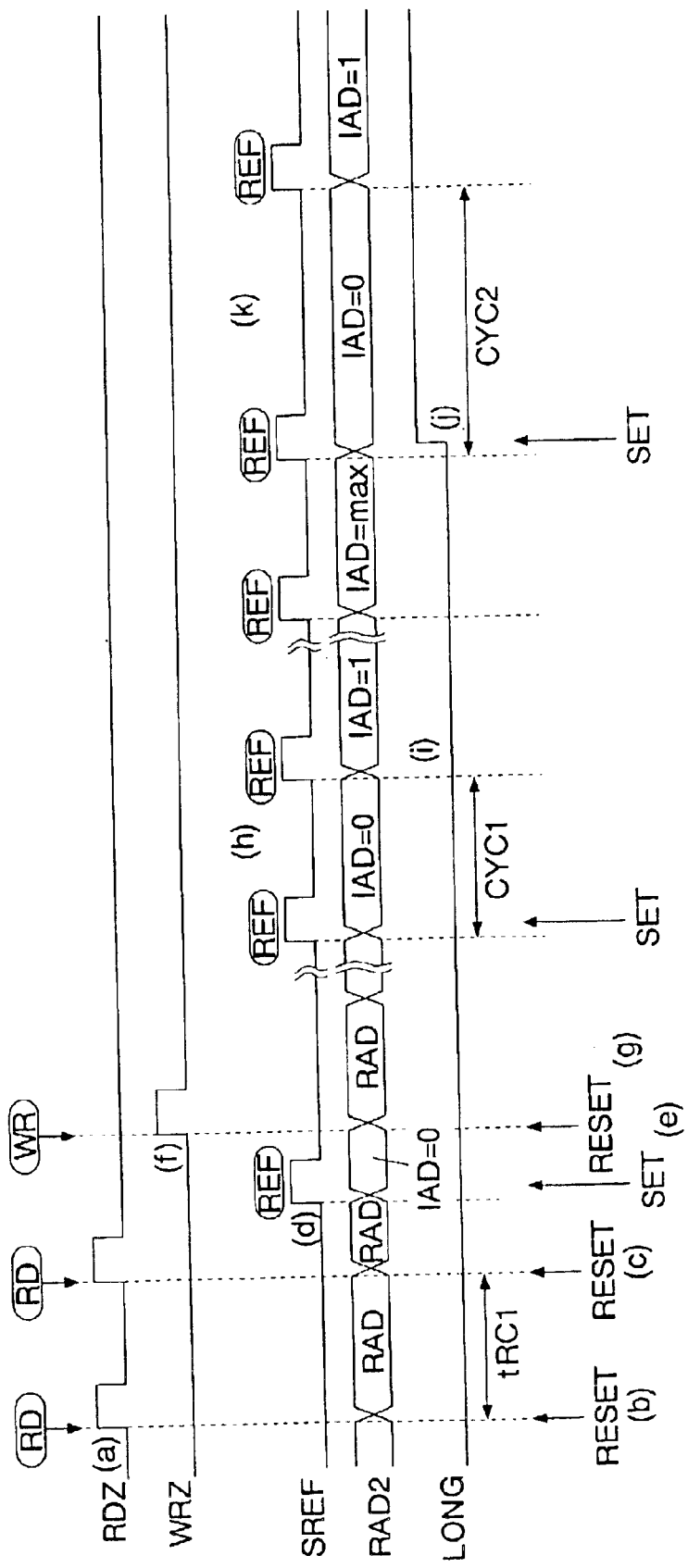
FIG. 7 is a timing chart showing the operation of the semiconductor memory of the first embodiment.

FIG. 7 shows the operation of the semiconductor memory of the first embodiment.

In this example, a read command RD is supplied twice before a write command WR is supplied once. The supply of the write command WR is preceded by the output of the refresh request signal SREF (refresh command REF). After the write command WR is supplied, neither the read command RD nor the write command WR is supplied so that refresh operations alone are performed in response to the refresh commands REF.

The pseudo SRAM of this embodiment is capable of a single access operation (a read operation or a write operation) and a single refresh operation within a cycle time tRC1 which is the minimum input interval of access requests (read or write requests). The pseudo SRAM can thus perform refresh operations without being recognized by the system on which the pseudo SRAM is mounted. That is, the refresh operations can be hidden from the exterior.

Initially, in response to the first read command RD, the read control signal RDZ is output (FIG. 7(a)), thereby selecting a word line WL corresponding to the address signal RAD that is supplied along with the read command RD. Then, a read operation is performed. The consecutive refresh judgement circuit 14 shown in FIG. 1 resets its internal latches in synchronization with the rising edge of the read control signal RDZ (FIG. 7(b)).

Next, a read operation is performed in response to the second read command RD. The latches in the consecutive refresh judgement circuit 14 are reset again in synchronization with the rising edge of the read control signal RDZ (FIG. 7(c)).

After the read operation or during the read operation, the refresh request signal SREF is output (FIG. 7(d)) so that a refresh operation is performed after the read operation. When the refresh address counter 26 shown in FIG. 1 outputs a refresh address IAD="0", the consecutive refresh judgement circuit 14 sets the internal latches (FIG. 7(e)).

Next, a write operation is performed in response to the write command WR (FIG. 7(f)). The latches in the consecutive refresh judgement circuit 14 are reset again in synchronization with the rising edge of the write control signal WRZ (FIG. 7(g)). In this way, the latches in the consecutive refresh judgement circuit 14 are reset in synchronization with a read operation or a write operation.

Subsequently, the refresh request signals SREF are output with the cycle CYC1 of the oscillator OSC1 shown in FIG. 2 (FIG. 7(h)). The cycle CYC1 of the oscillator OSC1 is set so that refresh operations are performed before the data retained in the memory cells MC disappears even if the cell voltages CELL do not reach the power supply voltage VDD or the ground voltage VSS in write operations and read operations.

The refresh address counter 26 counts in synchronization with the rising edges of the internal address latch signal IALZ, thereby incrementing the refresh address IAD by "1" (FIG. 7(i)). Note that while the cycle time tRC1 and the refresh cycle CYC1 are represented by the arrows of approximately the same lengths, the actual refresh cycle CYC1 is set at several tens of times or more the cycle time tRC1.

The consecutive refresh judgement circuit 14 sets the internal latches when the refresh address IAD changes to "0". Then, at the second time the refresh address IAD becomes "0" without the intervention of the read request or the write request to the memory cells MC, i.e., when the refresh address counter 26 goes through a single round, the consecutive refresh judgement circuit 14 activates the cycle changing signal LONG (FIG. 7j)).

Here, the refresh operations have been consecutively performed on all the refresh areas REFA of the memory core 34 (n areas) without a read operation or a write operation. That is, all the memory cells MC in the memory core 34 are fully written. Consequently, the subsequent refresh operations may be performed with the refresh cycle of CYC2 which is longer than the cycle CYC1.

The refresh timer 16 shown in FIG. 2 receives the cycle changing signal LONG of high level, and outputs the refresh request signal SREF with the cycle CYC2 of the oscillator OSC2 (FIG. 7(k)). Since the cycle CYC2 is longer than the cycle CYC1, the refresh cycle is extended while the cycle changing signal LONG is at high level.

As above, the cycle time tRC1 can be reduced by shortening the refresh cycle until the refresh address counter 26 goes through a single round. The period of the shorter refresh cycle lasts only while the refresh address counter 26 goes through a single round. This means little increase in the power consumption (standby current, data retention current) in a standby state.

The cycle changing signal LONG changes to low level (an inactivated state) when a new read command or write command is supplied to reset the latches in the consecutive refresh judgement circuit 14.

Figure 8:
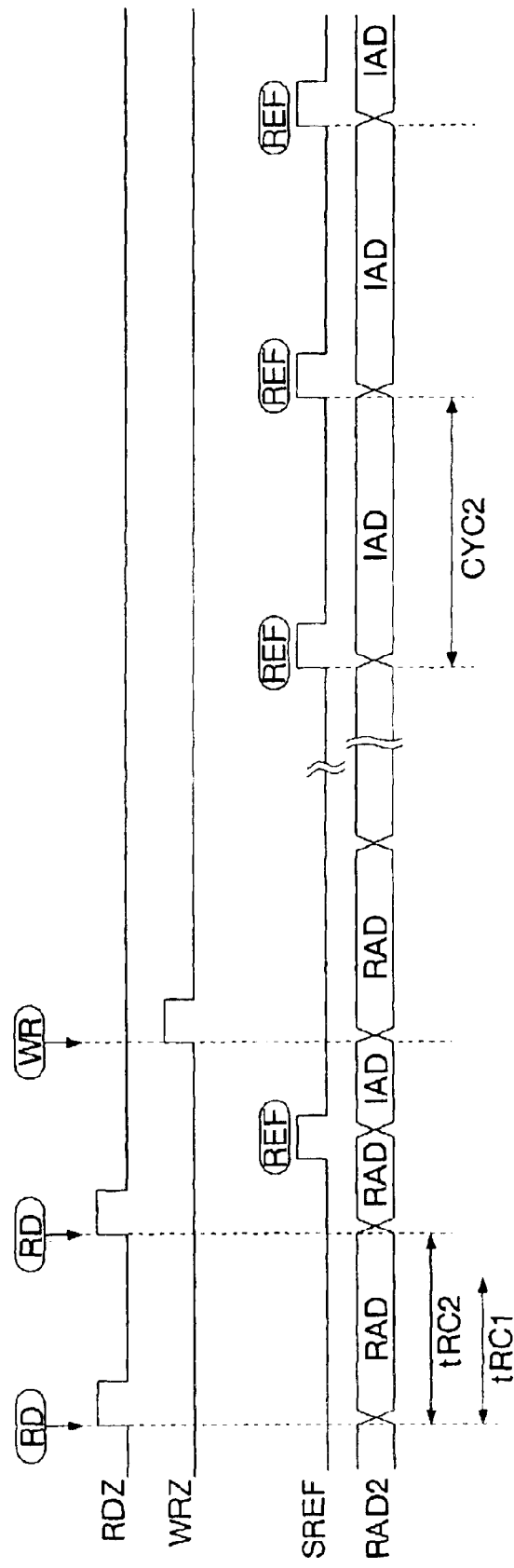
FIG. 8 is a timing chart showing a comparative example of the operation of the semiconductor memory.

FIG. 8 shows a comparative example of the operation of the semiconductor memory. This semiconductor memory has a memory core that operates under the timing shown in FIG. 6 seen above.

The interval of output of the refresh request signal SREF (refresh cycle) is always fixed, being approximately the same as the cycle CYC2 of the oscillator OSC2. In this example, as described in FIG. 6, the refresh cycle may be rendered relatively long because the generating timings of the sense amplifier activating signals PSA, NSA, the bit line control signal BRS, and the word line control signal WLZ are set so that the memory cells MC can be fully written with data even in write operations and read operations. The cycle time tRC2 for the read operations and write operations, however, is longer than the cycle time tRC1. This precludes an improvement in data transfer rate (I/O bus occupation rate).

As above, according to the present embodiment, the data read from the memory cells MC is fully written in refresh operations corresponding to refresh commands REF. In read operations corresponding to the read commands RD and in write operations corresponding to the write commands WR, data is not fully written for the sake of reduced cycle time tRC. Besides, a predetermined number of refresh commands REF are generated consecutively without the intervention of the read command RD or the write command WR and the memory cells MC are all refreshed before the cycle of generating the refresh request signal SREF is extended. As a result, the cycle time tRC can be reduced to improve the data transfer rate with no increase in standby current. In particular, a pseudo SRAM which performs refresh operations automatically inside can be reduced in cycle time tRC with no increase in standby current.

By using the consecutive refresh judgement circuit 14 and refresh timer 16 of simple configuration, the cycle time tRC can be reduced with no increase in the power consumption in standby mode.

The timing signal generator 24 sets an identical selecting period for the word lines WL in any of the read, write, and refresh operations. Since the selecting period of the word lines WL need not be changed depending on the operation, the timing signal generator 24 can be configured simply.

In the read, write, and refresh operations, the memory cells MC are connected to the power supply lines VDD, VSS through the sense amplifiers SA and the bit lines BL (or /BL). After the sense amplifiers SA start operating, data can thus be written to the memory cells MC at high speed. As a result, refresh operations, read operations, and write operations can be performed at high speed.

The consecutive refresh judgement circuit 14 is made of a latch circuit. Since the "0" change of the refresh address IAD can be detected without the use of a large-scale circuit such as a counter, the consecutive refresh judgement circuit 14 can be configured simply.

Figure 9:
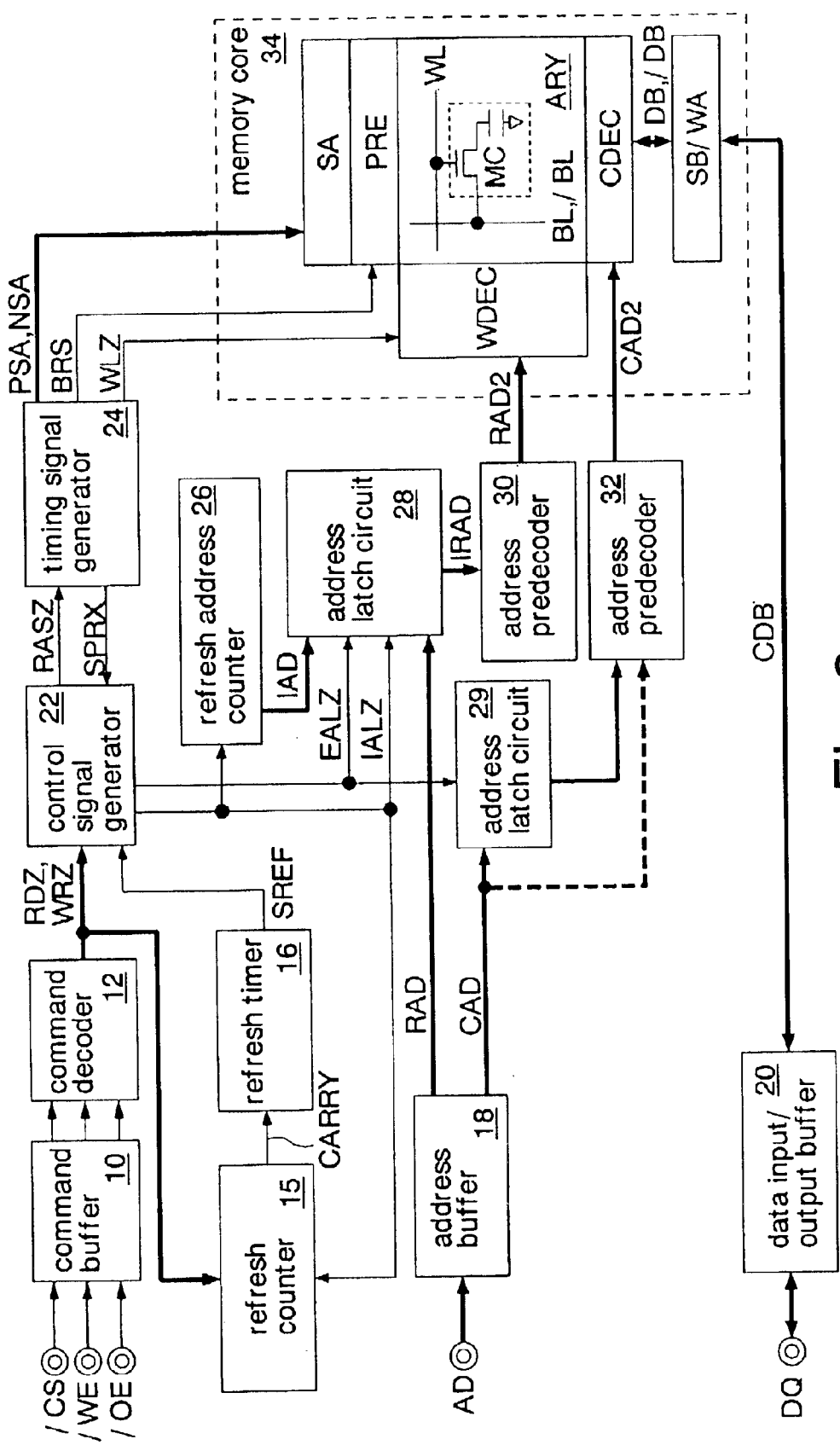
FIG. 9 is a block diagram showing a second embodiment of the semiconductor memory of the present invention.

FIG. 9 shows a second embodiment of the semiconductor memory of the present invention. The same elements as those described in the first embodiment will be designated by identical reference numbers or symbols. Detailed description thereof will be omitted here.

In this embodiment, a refresh counter 15 is formed instead of the consecutive refresh judgement circuit 14 of the first embodiment. The rest of the configuration is the same as in the first embodiment. That is, the semiconductor memory is formed as a pseudo SRAM with DRAM memory cells and an SRAM interface, by using CMOS technology.

The refresh counter 15 consists of 2-bit counters in the same number of bits as the number of word lines WL (to be described later). The refresh counter 15 is reset in synchronization with the read control signal RDZ (read request) or the write control signal WRZ (write request), and counts in synchronization with the internal address latch signal IALZ. The refresh counter 15 changes a carryover signal CARRY (cycle changing signal) to high level when its counter value changes from a maximum to a minimum, i.e., upon carryover. Then, after the occurrence of carryover, the refresh counter 15 maintains the carryover signal CARRY at high level until a new read command (read request) or write command (write request) is supplied.

The refresh timer 16 outputs the refresh request signal SREF (internal refresh command) with predetermined cycles. The refresh timer 16 outputs the refresh request signal SREF with a cycle CYC1 shown in FIG. 10 to be seen later when the carryover signal CARRY is at low level. When the carryover signal CARRY is at high level, the refresh timer 16 outputs the refresh request signal SREF with a cycle CYC2 which is longer than the cycle CYC1.

The refresh counter 15 and the refresh timer 16 operate as a refresh control circuit for extending the cycle of generating the refresh request signal SREF when a predetermined number of refresh request signals SREF are generated consecutively without the intervention of a read request or a write request.

Figure 10:
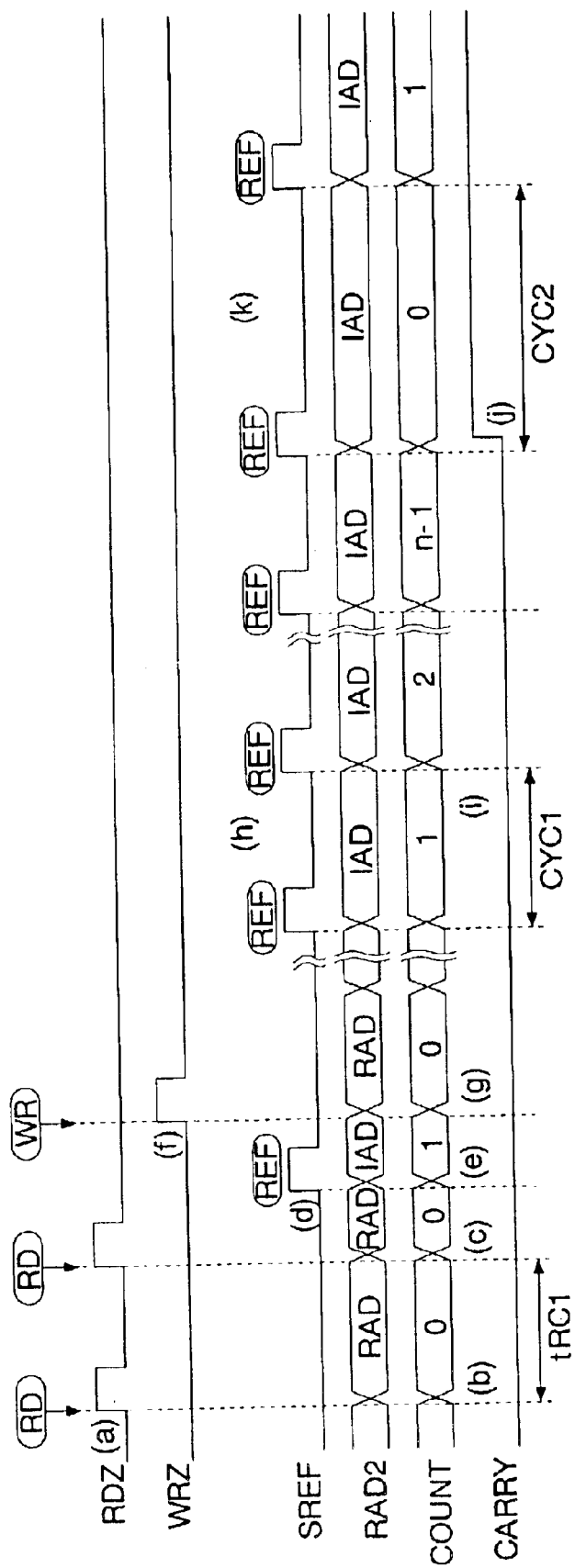
FIG. 10 is a timing chart showing the operation of the semiconductor memory of the second embodiment.

FIG. 10 shows the operation of the semiconductor memory of the second embodiment.

In this example, a read command RD is supplied twice before a write command WR is supplied once. The supply of the write command WR is preceded by the output of the refresh request signal SREF (refresh command REF). After the write command WR is supplied, neither the read command RD nor the write command WR is supplied so that refresh operations alone are performed in response to the refresh commands REF.

The pseudo SRAM of this embodiment is capable of a single access operation (a read operation or a write operation) and a single refresh operation within a cycle time tRC1 which is the minimum input interval of access requests (read or write requests). The pseudo SRAM can thus perform refresh operations without being recognized by the system on which the pseudo SRAM is mounted. That is, the refresh operations can be hidden from the exterior.

Initially, in response to the first read command RD, the read control signal RDZ is output (FIG. 10(a)), thereby selecting a word line WL corresponding to the address signal RAD that is supplied along with the read command RD. Then, a read operation is performed. The refresh counter 15 shown in FIG. 9 resets its counter value COUNT to "0" in synchronization with the rising edge of the read control signal RDZ (FIG. 10(b)).

Next, a read operation is performed in response to the second read command RD. The counter value COUNT is reset to "0" again in synchronization with the rising edge of the read control signal RDZ (FIG. 10(c)).

After the read operation or during the read operation, the refresh request signal SREF is output (FIG. 10(d)) so that a refresh operation is performed after the read operation. The refresh counter 15 changes the counter value COUNT from "0" to "1" in synchronization with the rising edge of the internal address latch signal IALZ (not shown) for latching the refresh address IAD (FIG. 10(e)).

Next, a write operation is performed in response to the write command WR (FIG. 10(f)). The counter value COUNT is reset to "0" again in synchronization with the rising edge of the write control signal WRZ (FIG. 10(g)). In this way, the refresh counter 15 is reset in synchronization with a read operation or a write operation.

Subsequently, as in the first embodiment (FIG. 2), the refresh request signals SREF are output with the cycle CYC1 of the oscillator OSC1 (FIG. 10(h)). The cycle CYC1 of the oscillator OSC1 is set so that refresh operations are performed before the data retained in the memory cells MC disappears even if the cell voltages CELL do not reach the power supply voltage VDD or the ground voltage VSS in write operations and read operations.

The refresh counter 15 counts in synchronization with the rising edges of the internal address latch signal IALZ, thereby incrementing the counter value COUNT by "1" (FIG. 10(i)). Note that while the cycle time tRC1 and the refresh cycle CYC1 are represented by the arrows of approximately the same lengths, the actual refresh cycle CYC1 is set at several tens of times or more the cycle time tRC1.

With the outputs of the refresh request signal SREF, the counter value COUNT increases to reach the maximum value of n−1. Then, an (n−1)th refresh operation is performed. Upon the next refresh request signal SREF, the counter value COUNT increments by "1" to return "0". The refresh counter 15 changes the carryover signal CARRY to high level (an inactivated state) in synchronization with the "0" change of the counter value COUNT (FIG. 10(j)).

Here, refresh operations have been consecutively performed on all the refresh areas REFA (n areas) of the memory core 34 without a read operation or a write operation. That is, all the memory cells MC in the memory core 34 are fully written. Consequently, the subsequent refresh operations may be performed with the refresh cycle of CYC2 which is longer than the cycle CYC1.

The refresh timer 16 shown in FIG. 9 receives the carryover signal CARRY of high level, and outputs the refresh request signal SREF with the cycle CYC2 of the oscillator OSC2 (FIG. 10(k)). Since the cycle CYC2 is longer than the cycle CYC1, the refresh cycle is extended while the carryover signal CARRY is at high level. In other words, the refresh cycle can be extended after the counter value COUNT of the refresh counter 15 goes through a single round without being reset.

In this way, the cycle time tRC1 can be reduced by shortening the refresh cycle until the counter value COUNT of the refresh counter 15 goes through a single round. The period of the shorter refresh cycle lasts only while the counter value COUNT goes through a single round. This means little increase in the power consumption (standby current, data retention current) in a standby state.

The carryover signal CARRY changes to low level (an inactivated state) when a new read command or write command is supplied to reset the refresh counter 15.

As above, the present embodiment can offer the same effects as those of the first embodiment.

Figure 11:
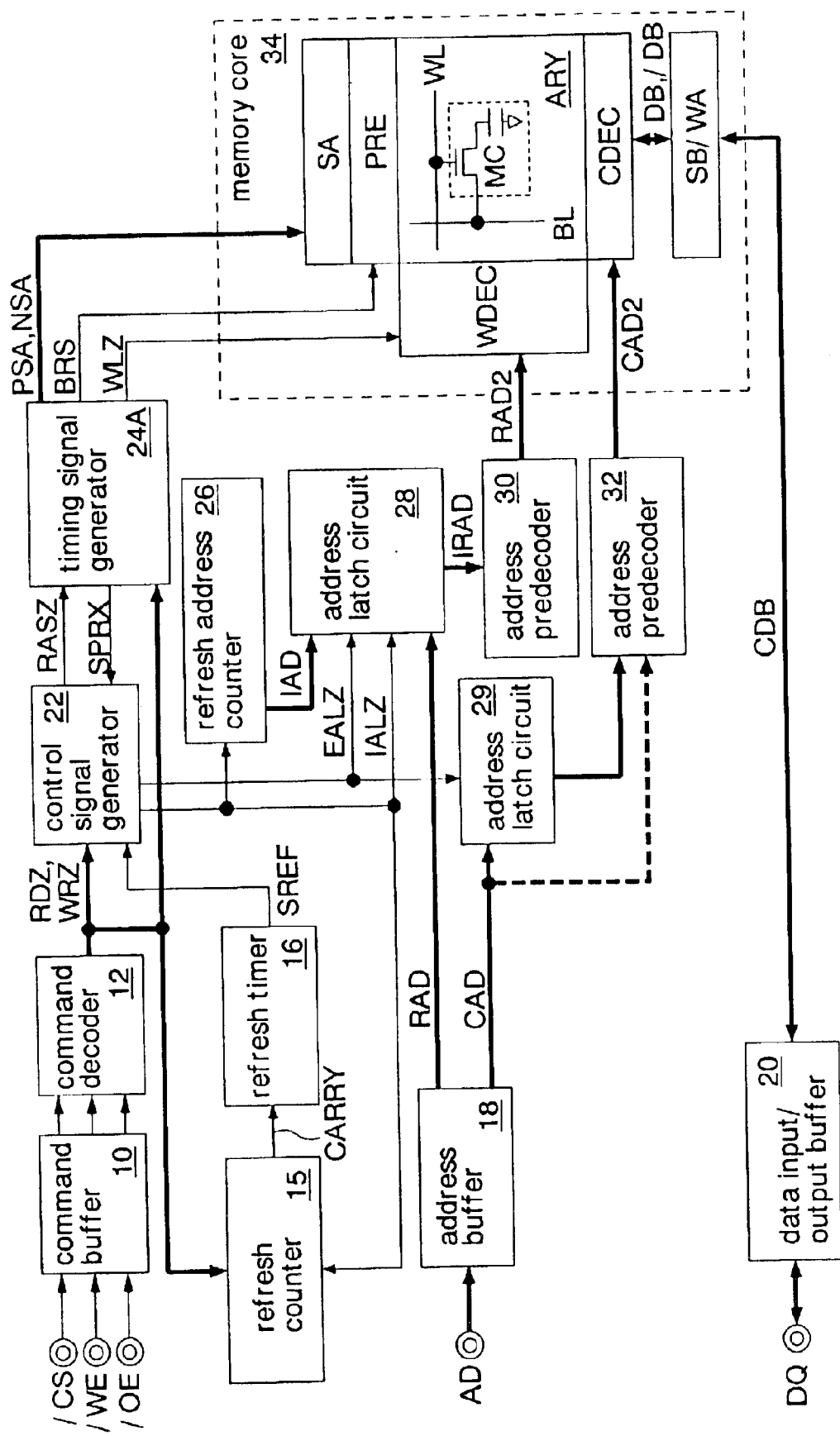
FIG. 11 is a block diagram showing a third embodiment of the semiconductor memory of the present invention.

FIG. 11 shows a third embodiment of the semiconductor memory of the present invention. The same elements as those described in the first and second embodiments will be designated by identical reference numbers or symbols. Detailed description thereof will be omitted here.

In this embodiment, a timing signal generator 24A is formed instead of the timing signal generator 24 of the second embodiment. The rest of the configuration is the same as in the second embodiment. That is, the semiconductor memory is formed as a pseudo SRAM with DRAM memory cells and an SRAM interface, by using CMOS technology.

The timing signal generator 24A outputs the sense amplifier activating signals PSA and NSA in synchronization with the row operation control signal RASZ. Moreover, the timing signal generator 24A switches the output timings of the PSA and NSA signals, the BRS signal, and the WLZ signal between when it receives the read control signal RDZ or write control signal WRZ and when not.

More specifically, the timing signal generator 24A shortens the output periods of the PSA and NSA signals, the BRS signal, and the WLZ signal when it receives the RDZ signal or the WRZ signal (a read operation or a write operation). In other words, the output periods of the PSA and NSA signals, the BRS signal, and the WLZ signal in a read operation or a write operation are shorter than those of the PSA and NSA signals, the BRS signal, and the WLZ signal in a refresh operation where neither the RDZ signal nor WRZ signal is output but the RASZ signal is.

Figure 12:
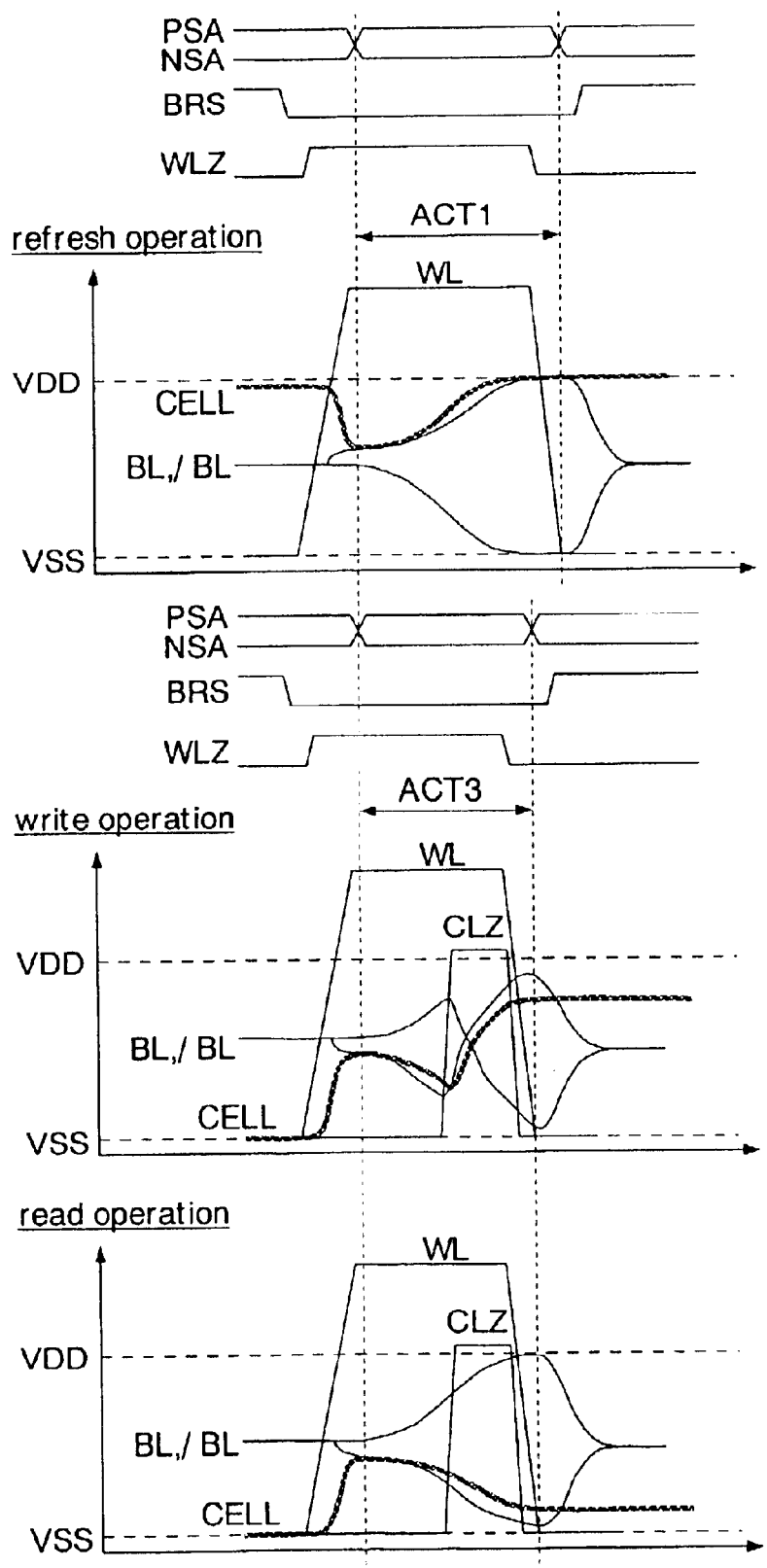
FIG. 12 is a timing chart showing the operation of the memory core in the semiconductor memory of the third embodiment.

FIG. 12 shows the operation of the memory core in the semiconductor memory of the third embodiment. Description will be omitted of the same operation as in the first embodiment (FIG. 5).

The PSA and NSA signals, the BRS signal, and the WLZ signal are output at the respective same timings in a refresh operation, a write operation, and a read operation. In a refresh operation, the activating period ACT1 of the sense amplifiers SA, the selecting period of the word lines WL, and the reset period of the precharge operation are the same as in the first embodiment.

In a write operation and a read operation, the activating period of the sense amplifiers SA is set at a period ACT3 which is shorter than the activating period ACT1. In accordance with the activating period ACT3, the selecting period of the word lines WL and the reset period of the precharge operation are also set at shorter than in a refresh operation. Consequently, in a write operation and a read operation, the inactivating timing of the sense amplifiers SA, the deselecting timing of the word lines WL, and the start timing of the precharge operation are all earlier than in a refresh operation.

Since the operation period of the sense amplifiers SA is shorter in a write operation and a read operation, differences of the cell voltages CELL of the memory cells MC to the power supply voltage VDD and the ground voltage VSS become greater than in the first embodiment. That is, the write voltages to the memory cells MC in a write operation and a read operation become lower.

Accordingly, the refresh period after a write operation and a read operation must be rendered shorter than in the first embodiment. Meanwhile, the reduction in the operation period of the sense amplifiers SA can shorten the write operating time and read operating time (access time).

Figure 13:
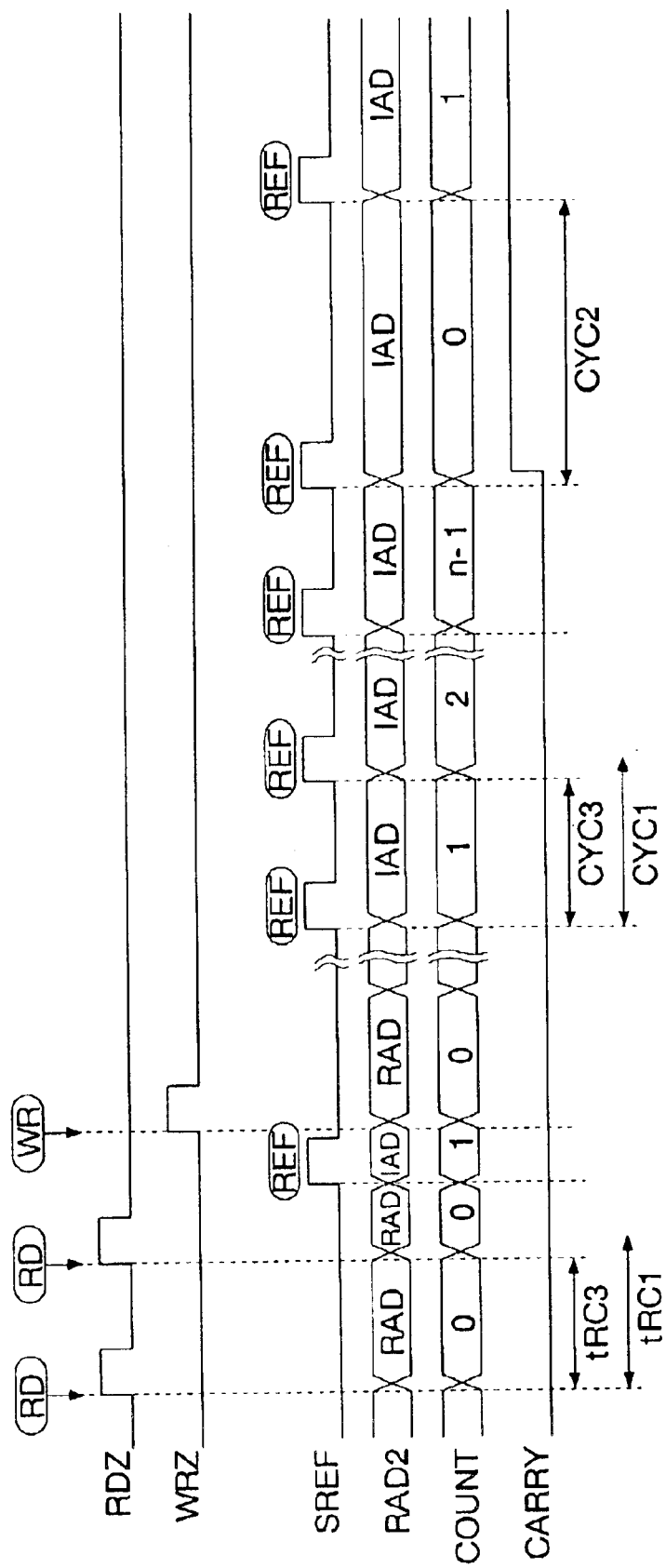
FIG. 13 is a timing chart showing the operation of the semiconductor memory of the third embodiment.

FIG. 13 shows the operation of the semiconductor memory of the third embodiment. Description will be omitted of the same operation as in the second embodiment (FIG. 10).

According to this embodiment, the cycle time tRC2 for read operations and write operations is shorter than the cycle time tRC1 of the first embodiment. In addition, the refresh period CYC3 for the refresh counter 15 to output the carryover signal CARRY is shorter than the refresh cycle CYC1 of the first embodiment. The period of the refresh cycle "tRC3" lasts only while the counter value COUNT goes through a single round. This means little increase in the power consumption (standby current, data retention current) in a standby state.

After the refresh counter 15 goes through a single round to output the carryover signal CARRY, the refresh cycle becomes the same as the cycle CYC2 of the first embodiment. Consequently, the cycle time can be further reduced with little increase in the power consumption in a standby state.

This embodiment can offer the same effects as those of the first embodiment described above. Besides, in this embodiment, the timing signal generator 24A sets the selecting period of the word lines WL and the activating period ACT3 of the sense amplifiers SA in read operations and write operations at shorter than the selecting period of the word lines WL and the activating period ACT1 of the sense amplifiers SA in refresh operations, respectively. More specifically, the timing signal generator 24A sets the deselecting timing of the word lines WL and the inactivating timing of the sense amplifiers SA in read operations and write operations at earlier than the deselecting timing of the word lines WL and the inactivating timing of the sense amplifiers SA in refresh operations, respectively. Consequently, the cycle time tRC can be further reduced with no increase in the power consumption in standby mode.

Figure 14:
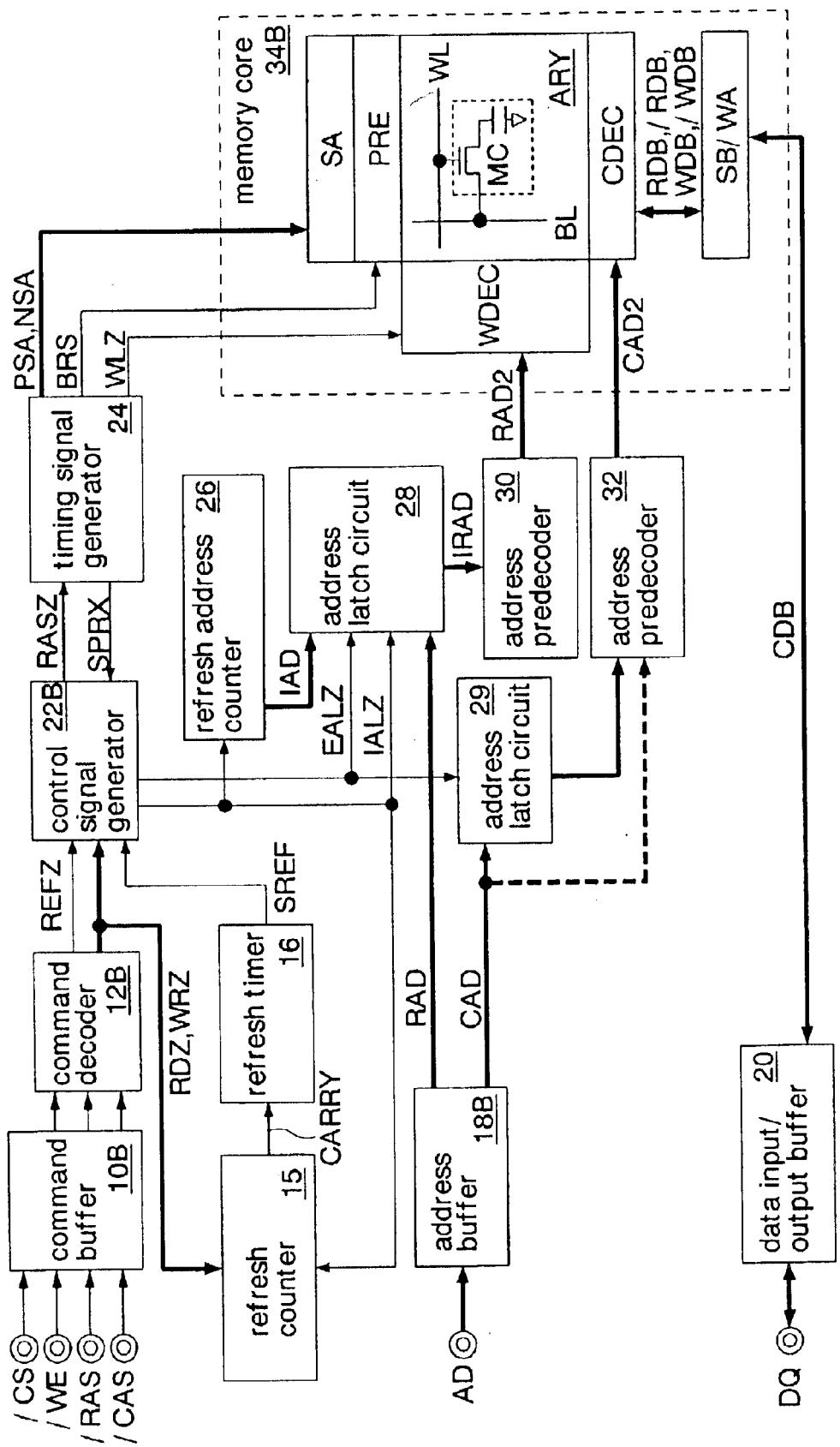
FIG. 14 is a block diagram showing a fourth embodiment of the semiconductor memory of the present invention.

FIG. 14 shows a fourth embodiment of the semiconductor memory of the present invention. The same elements as those described in the first and second embodiments will be designated by identical reference numbers or symbols. Detailed description thereof will be omitted here.

This semiconductor memory is formed as a DRAM having a self refresh function, by using CMOS technology. The self refresh function is the function of performing refresh operations automatically within the DRAM when in a standby state to retain the data written in its memory cells.

In this embodiment, a command buffer 10B, a command decoder 12B, an address buffer 18B, a control signal generator 22B, and a memory core 34B are formed instead of the command buffer 10, the command decoder 12, the address buffer 18, the control signal generator 22, and the memory core 34 of the pseudo SRAM in the second embodiment. Moreover, the refresh timer 16 operates only when the chip select signal /CS is at high level. The rest of the configuration is almost the same as in the second embodiment.

The command buffer 10B receives command signals (the chip select signal /CS, the write enable signal /WE, a row address strobe signal /RAS, and a column address strobe signal /CAS) from the exterior. The /RAS signal and the /CAS signal are synchronous signals for receiving a row address signal RAD and a column address signal CAD.

The command decoder 12B decodes the command signals supplied from the command buffer 10B, and outputs any of a read control signal RDZ, a write control signal WRZ, and a refresh control signal REFZ.

The address buffer 18B receives the row address signal RAD or the column address signal CAD through address terminals AD. In order to reduce the number of address terminals AD, the DRAM of this embodiment adopts an address multiplexing method in which address signals are received in a time-divisional fashion.

A read command is recognized when the /CS signal of low level and the /WE signal of high level are supplied and the row address signal RAD and column address signal CAD are supplied in synchronization with the /RAS signal and /CAS signal, respectively. A write command is recognized when the /CS signal and /WE signal of low level are supplied and the row address signal RAD and column address signal CAD are supplied in synchronization with the /RAS signal and /CAS signal, respectively.

A refresh command is recognized when the /CS signal, /RAS signal, /CAS signal of low level and the /WE signal of high level are supplied. This DRAM need not be supplied with an address signal for designating memory cells to refresh (refresh address) in response to the refresh command. Refresh addresses are generated by the refresh address counter 26. That is, this DRAM has an auto refresh mode function.

The control signal generator 22B outputs the row operation control signal RASZ and the internal address latch signal IALZ when it receives the refresh control signal REFZ. The rest of the facilities are almost the same as those of the control signal generator 22 in the first embodiment.

Figure 15:
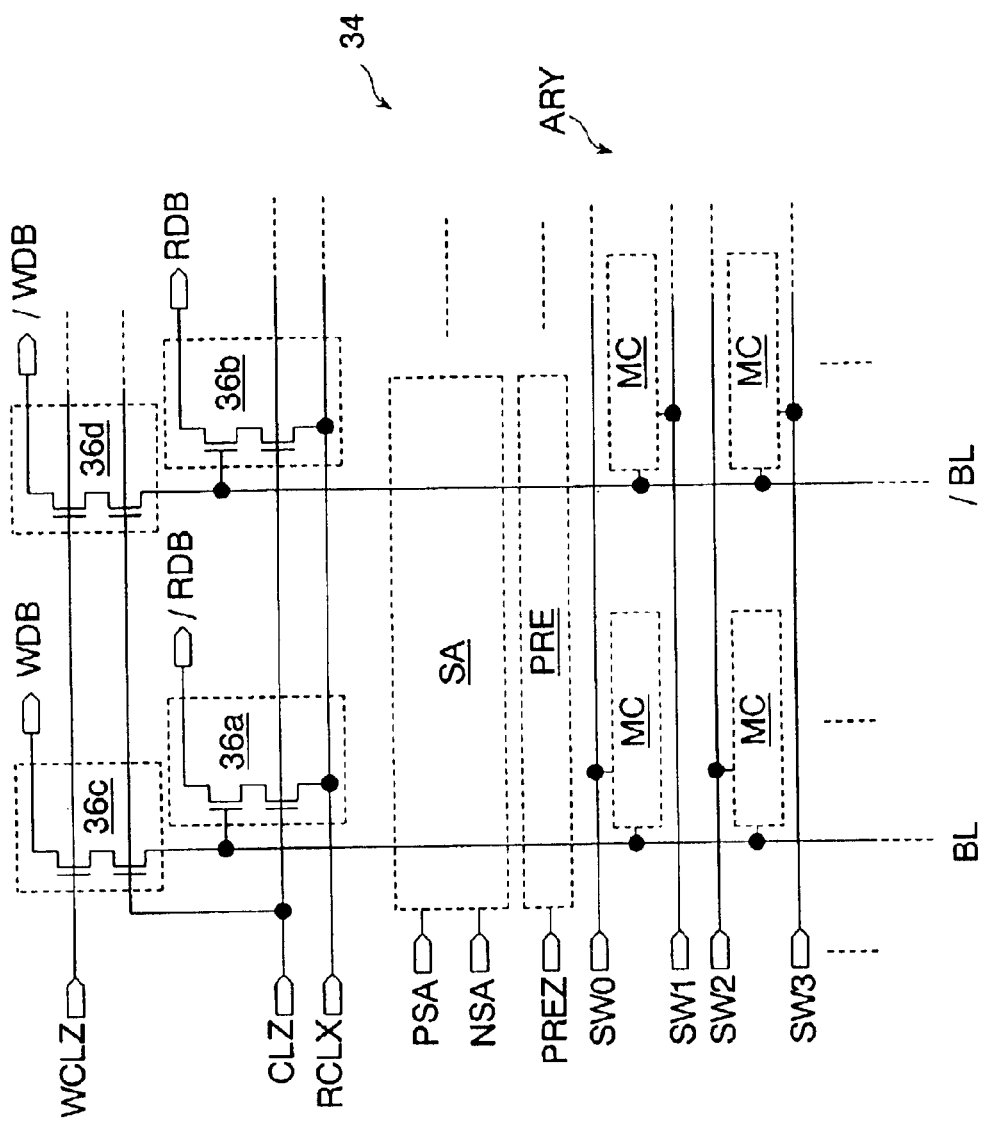
FIG. 15 is a circuit diagram showing the details of essential parts of the memory core shown in FIG. 14.

FIG. 15 shows the details of essential parts of the memory core 34B shown in FIG. 14.

The memory core 34B has column switches 36a, 36b, 36c, and 36d, each consisting of a series of two nMOSs for connecting bit lines BL and /BL to a read data bus /RDB, RDB and a write data bus WDB, /WDB, respectively.

The column switch 36a is connected at one end to the signal line of a read control signal RCLX and at the other end to the read data bus /RDB. The gate of the nMOS on the one end of the column switch 36a receives the column line signal CLZ. The gate of the nMOS on the other end of the column switch 36a is connected to the bit line BL.

The column switch 36b is connected at one end to the signal line of the read control signal RCLX and at the other end to the read data bus RDB. The gate of the nMOS on the one end of the column switch 36b receives the column line signal CLZ. The gate of the nMOS on the other end of the column switch 36b is connected to the bit line /BL.

As above, the method of controlling on/off the column switches 36a and 36b with the voltages of the bit lines BL and /BL is referred to as a direct sense method. According to the direct sense method, the bit lines BL, /BL and the read data bus /RDB, RDB are not in direct connection. Besides, the column switches 36a and 36b have amplifying capabilities. Consequently, when the sense amplifier SA is in operation, the bit lines BL and /BL can be prevented from varying in voltage under the influence of the read data bus /RDB, RDB.

The column switch 36c is connected at one end to the bit line BL and at the other end to the write data bus WDB. The gate of the nMOS on the one end of the column switch 36c receives the column line signal CLZ. The gate of the nMOS on the other end of the column switch 36c receives a write control signal WCLZ which is activated in a write operation in accordance with the column address signal CAD.

The column switch 36d is connected at one end to the bit line /BL and at the other end to the write data bus /WDB. The gate of the nMOS on the one end of the column switch 36d receives the column line signal CLZ. The gate of the nMOS on the other end of the column switch 36d receives the write control signal WCLZ.

Figure 16:
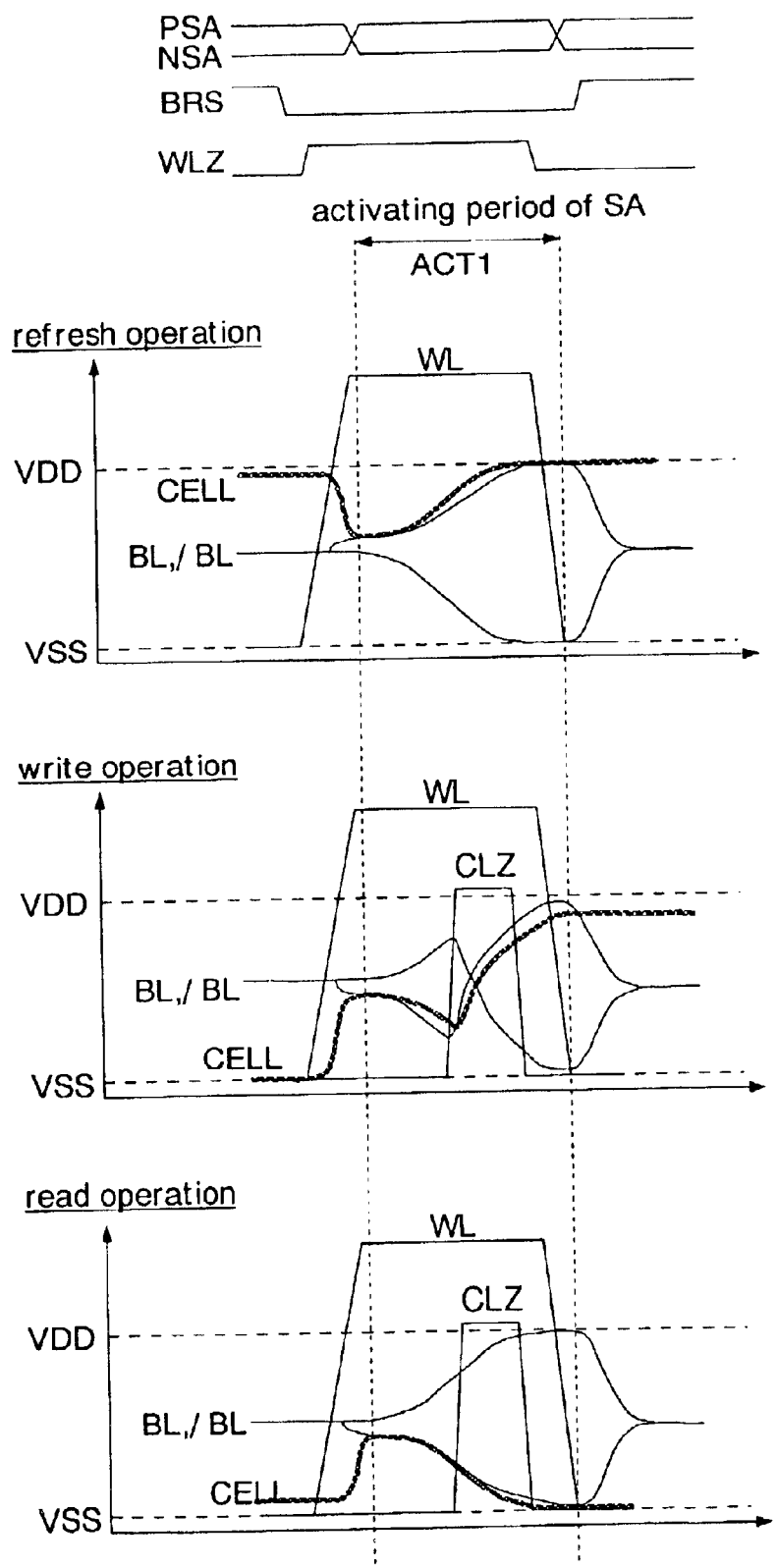
FIG. 16 is a timing chart showing the operation of the memory core in the semiconductor memory of the fourth embodiment.

FIG. 16 shows the operation of the memory core in the semiconductor memory of the fourth embodiment. Description will be omitted of the same operation as in the first embodiment (FIG. 5).

In a refresh operation, a write operation, and a read operation, all the timings of the PSA and NSA signals, the BRS signal, and the WLZ signal are the same as in the first embodiment. The DRAM of the present embodiment adopts the direct sense method, so that the bit lines BL and /BL are free from the influence of the data bus RDB, /RDB in a read operation. The cell voltages CELL thus reach the power supply voltage VDD or the ground voltage VSS in a read operation. That is, at the time of rewriting in a read operation, data is fully written to the memory cells MC. The rest of the operation is the same as in the first embodiment. Even in this example, a reduction in the operation period of the sense amplifiers SA can shorten the write operating time and read operating time (access time).

Figure 17:
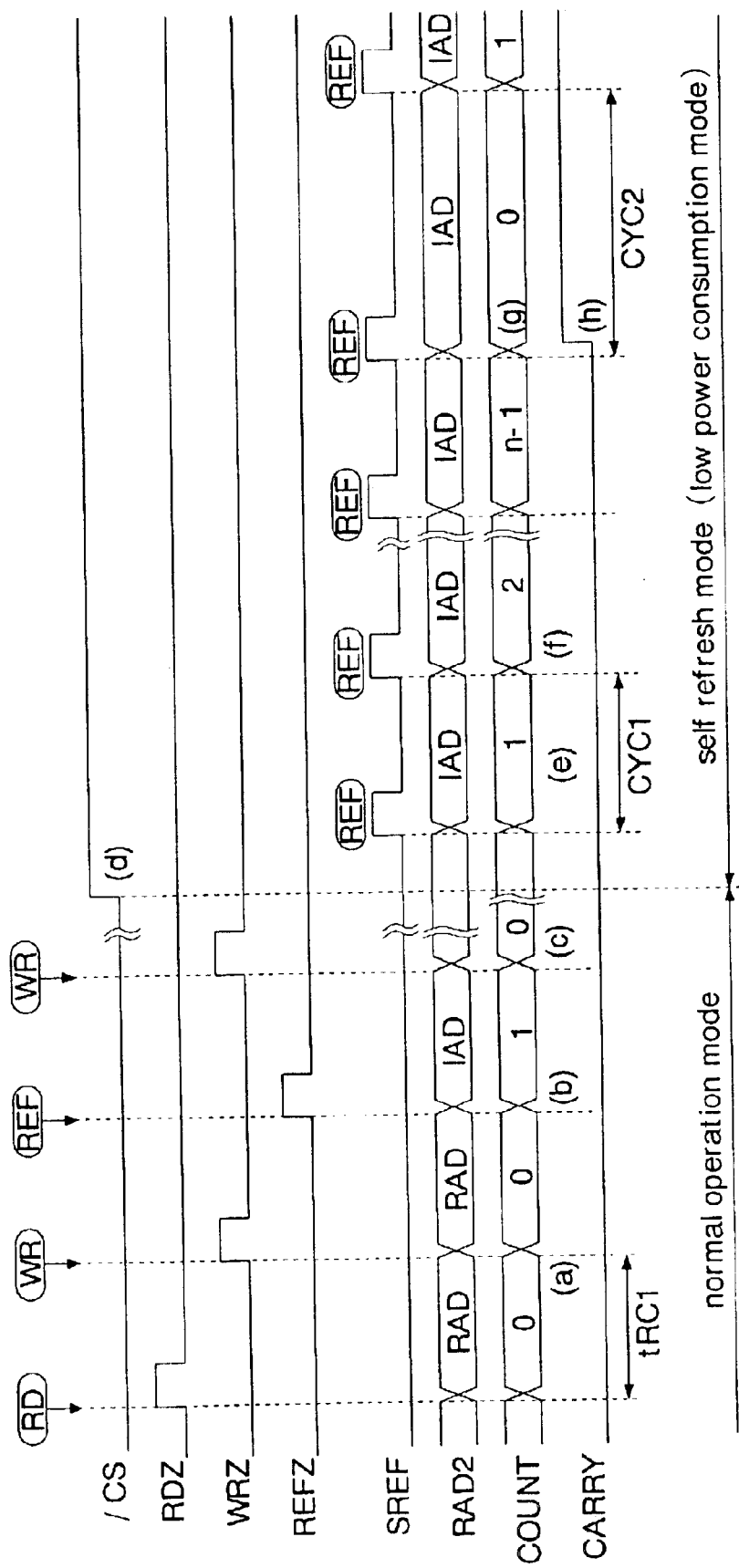
FIG. 17 is a timing chart showing the operation of the semiconductor memory of the fourth embodiment.

FIG. 17 shows the operation of the semiconductor memory of the fourth embodiment. Description will be omitted of the same operation as in the second embodiment (FIG. 10).

In this example, a read command RD, a write command WR, an external refresh command REF, and a write command WR are supplied in succession. Subsequently, the chip select signal /CS is changed to high level so that the DRAM shifts from normal operation mode to self refresh mode (low power consumption mode). In self refresh mode, refresh operations (self refresh) are performed in response to refresh commands REF that are generated internally (refresh request signals SREF).

As in the first embodiment, the read command RD, the write command WR, and the external refresh command REF are supplied at intervals of cycle time tRC1 (FIG. 17(a)). The refresh counter 15 changes the counter value COUNT from "0" to "1" in synchronization with the rising edge of the internal address latch signal IALZ (not shown) for latching the external refresh command REF (FIG. 17(b)). In response to the following write command WR, the counter value COUNT is reset to "0" again (FIG. 17(c)). Incidentally, in normal operation mode, the refresh timer 16 is not in operation. The change in the counter value COUNT thus has no effect on operation.

The /CS signal changes to high level, and the DRAM enters self refresh mode (FIG. 17(d)). Entering self refresh mode starts the refresh timer 16 to operate. The refresh timer 16 outputs the refresh request signal SREF at intervals of refresh cycle CYC1 (FIG. 17(e)). In response to each refresh request signal SREF, the internal address latch signal IALZ is output to perform a refresh operation.

The refresh counter 15 counts in synchronization with the rising edges of the internal address latch signal IALZ, thereby incrementing the counter value COUNT by "1" (FIG. 17(f)). The counter value COUNT reaches the maximum value n−1 before it is reset to "0" in response to the next refresh request signal SREF (FIG. 17(g)). The refresh counter 15 changes the carryover signal CARRY to high level (an inactivated state) in synchronization with the "0" change of the counter value COUNT (FIG. 17(h)). Then, the subsequent refresh operations are performed with the refresh cycle of CYC2 which is longer than the cycle CYC1.

This embodiment can offer the same effects as those of the first embodiment described above. Moreover, according to this embodiment, a DRAM that performs refresh operations automatically inside as well as in response to refresh requests from the exterior can be reduced in cycle time with no increase of the power consumption in standby mode.

Figure 18:
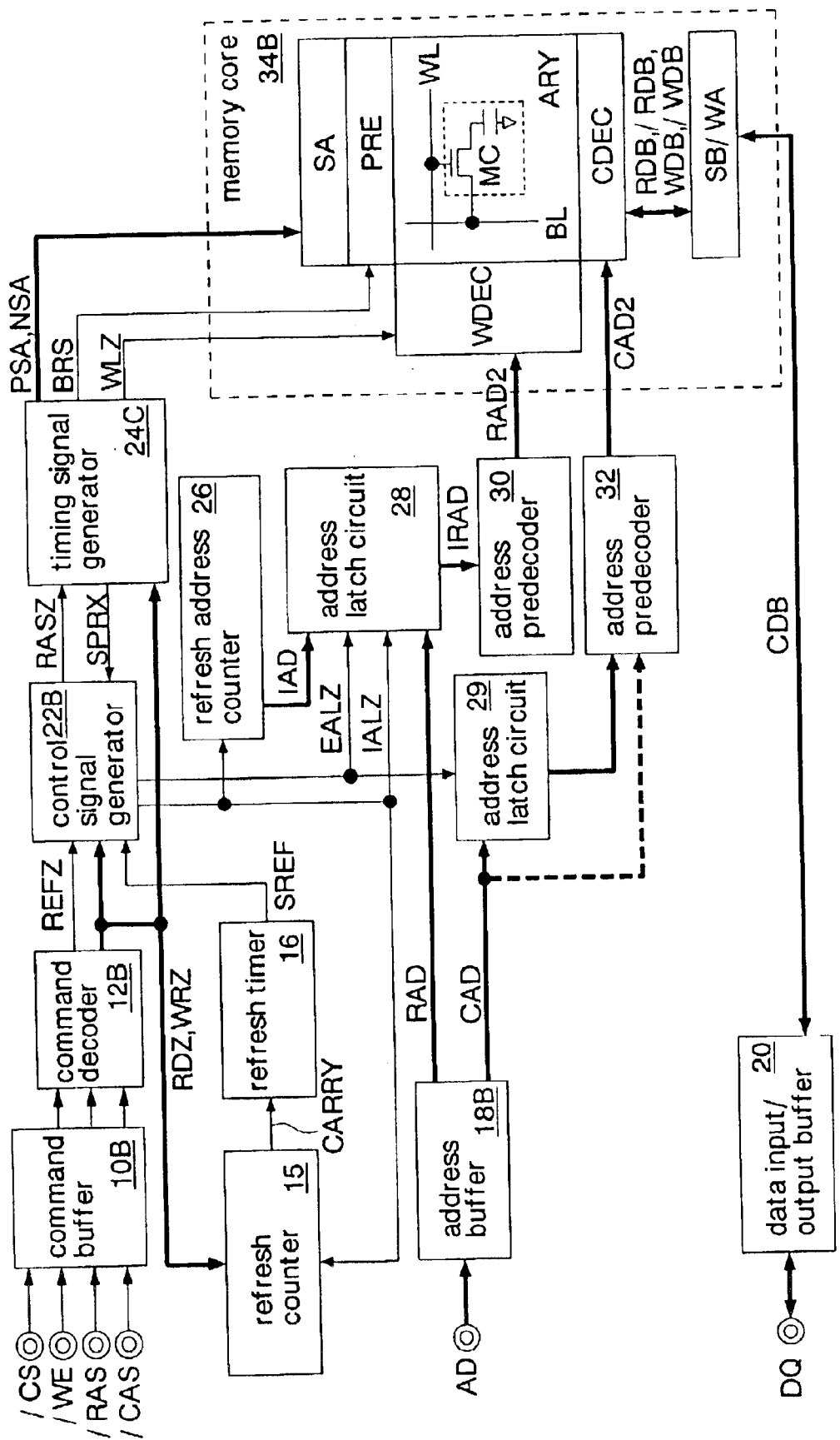
FIG. 18 is a block diagram showing a fifth embodiment of the semiconductor memory of the present invention.

FIG. 18 shows a fifth embodiment of the semiconductor memory of the present invention. The same elements as those described in the first to fourth embodiments will be designated by identical reference numbers or symbols. Detailed description thereof will be omitted here.

In this embodiment, the timing signal generator 24A of the third embodiment is formed instead of the timing signal generator 24 of the fourth embodiment. The rest of the configuration is the same as in the fourth embodiment. That is, the semiconductor memory is formed as a DRAM having a self refresh function, by using CMOS technology.

The timing signal generator 24A shortens the output periods of the PSA and NSA signals, the BRS signal, and the WLZ signal when it receives the RDZ signal or the WRZ signal (a read operation or write operation). In other words, the output periods of the PSA and NSA signals, the BRS signal, and the WLZ signal in a read operation or a write operation are set at shorter than those of the PSA and NSA signals, the BRS signal, and the WLZ signal in a refresh operation.

In this embodiment, the activating period of the sense amplifiers SA in a write operation and a read operation is set at the period ACT3 which is shorter than the activating period ACT1, as in the third embodiment described above (FIG. 12). In accordance with the activating period ACT3, the selecting period of the word lines WL and the reset period of the precharge operation are also set at shorter than in a refresh operation. Consequently, the write operating time and the read operating time are made shorter than in the third embodiment. That is, it is possible to reduce the access time.

Figure 19:
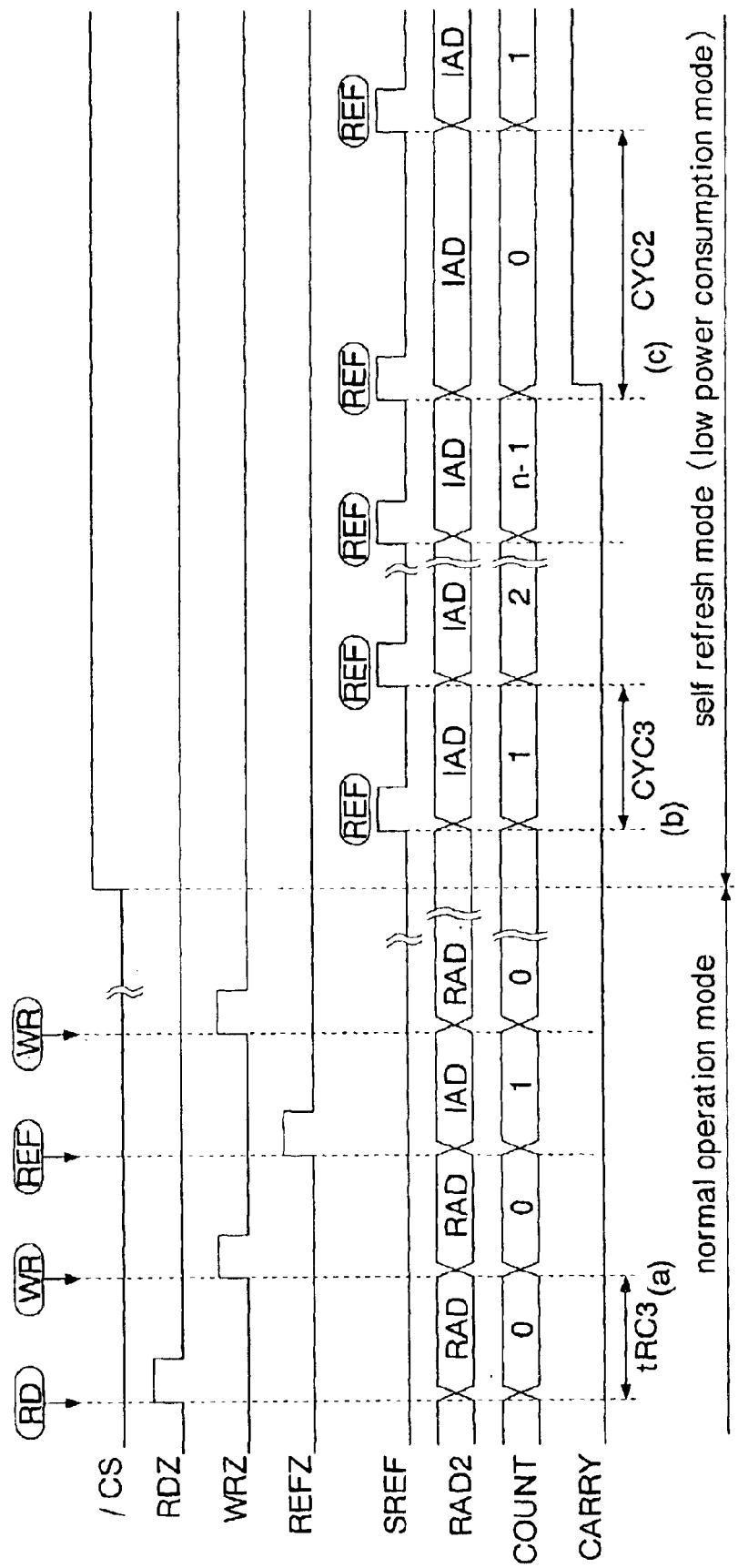
FIG. 19 is a timing chart showing the operation of the semiconductor memory of the fifth embodiment.

FIG. 19 shows the operation of the semiconductor memory of the fifth embodiment. Description will be omitted of the same operation as in the third and fourth embodiments (FIGS. 13 and 17).

In this example, a read command RD, a write command WR, an external refresh command REF, and a write command WR are supplied in succession. Subsequently, the chip select signal /CS is changed to high level so that the DRAM shifts from normal operation mode to self refresh mode (low power consumption mode).

In normal operation mode, the read command RD, the write command WR, and the external refresh command REF are supplied at intervals of cycle time tRC3 (FIG. 19(a)) as in the second embodiment. The /CS signal changes to high level to enter self refresh mode. Then, the refresh period CYC3 for the refresh counter 15 to output the carryover signal CARRY with becomes shorter than the refresh cycle CYC1 of the first embodiment (FIG. 19(b)).

In self refresh mode, the counter value COUNT changes from the maximum value n −1 to "0", before refresh operations are performed with the refresh cycle of CYC2 which is longer than the cycle CYC1 (FIG. 19(c)).

This embodiment can offer the same effects as those obtained from the first to third embodiments described above.

Figure 20:
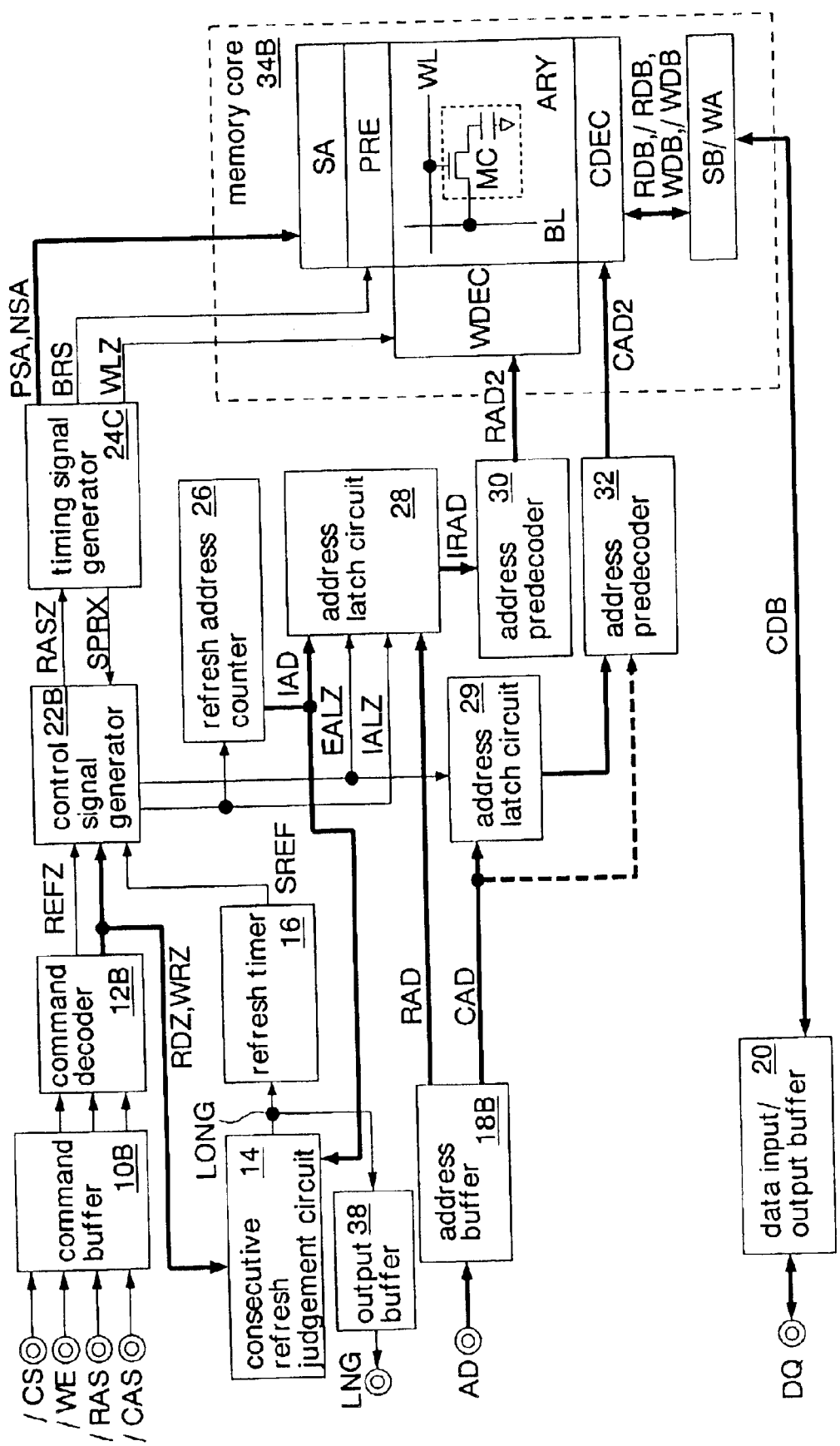
FIG. 20 is a block diagram showing a sixth embodiment of the semiconductor memory of the present invention.

FIG. 20 shows a sixth embodiment of the semiconductor memory of the present invention. The same elements as those described in the first to fifth embodiments will be designated by identical reference numbers or symbols. Detailed description thereof will be omitted here.

In this embodiment, the refresh counter 15 of the fifth embodiment is replaced with the consecutive refresh judgement circuit 14. Besides, an output buffer 38 is formed additionally. The rest of the configuration is the same as in the fifth embodiment. That is, the semiconductor memory is formed as a DRAM having a self refresh function, by using CMOS technology.

The output buffer 38 receives the cycle changing signal LONG output from the consecutive refresh judgement circuit 14, and outputs the received signal to an external terminal LNG. That is, in this embodiment, notification that the refresh address counter 26 goes through a single round is given to the exterior.

Figure 21:
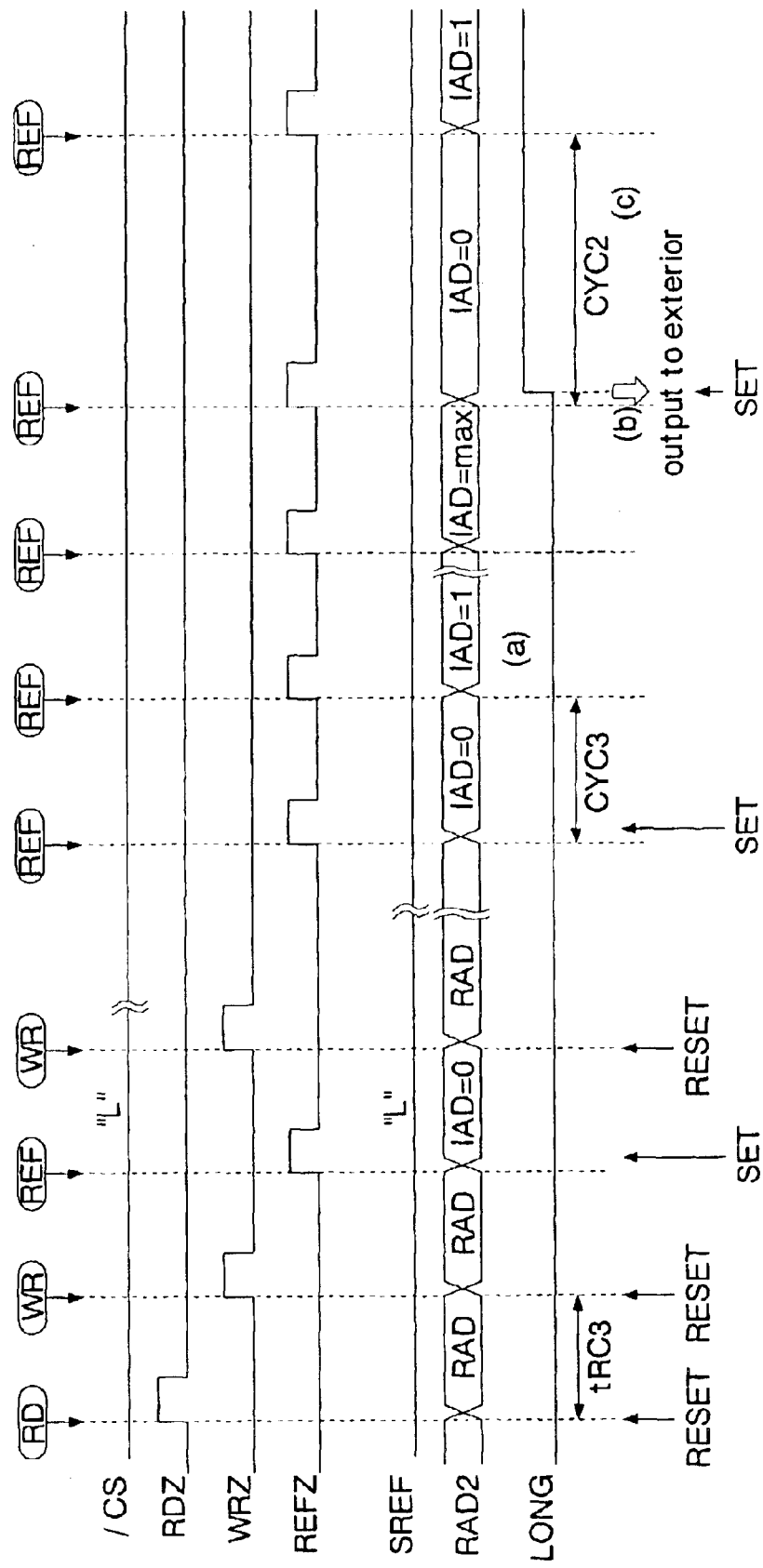
FIG. 21 is a timing chart showing the operation of the semiconductor memory of the sixth embodiment.

FIG. 21 shows the operation of the semiconductor memory of the sixth embodiment. Description will be omitted of the same operation as in the first embodiment (FIG. 7).

In this example, a read command RD, a write command WR, an external refresh command REF, and a write command WR are supplied in succession. Subsequently, external refresh commands REF are supplied in succession so that auto refresh is performed by using the refresh address counter 26. That is, the DRAM is operating in normal operation mode.

The intervals of supply of the read command RD, the write command WR, and the external refresh command REF are set at "tRC". The intervals of supply of the external refresh commands REF are set at "CYC3".

When neither the read command RD nor the write command WR is supplied but the refresh commands REF are supplied consecutively so that the refresh address counter 26 goes through a single round, the consecutive refresh judgement circuit 14 outputs the cycle changing signal LONG (FIG. 20(a)). The cycle changing signal LONG is output to the exterior of the DRAM through the external terminal LNG (FIG. 20(b)).

The system that controls the DRAM changes the intervals of supply of the refresh commands REF (refresh cycle) from CYC3 to CYC2 in response to the cycle changing signal LONG (FIG. 20(c)). That is, after the refresh address counter 26 goes through a single round, the refresh cycle is extended by the system that controls the DRAM. The extended refresh cycle reduces the standby power consumption in normal operations.

Incidentally, the DRAM has self refresh mode. Thus, the DRAM operates under the same timing as in the fifth embodiment (FIG. 19) across a high-level change of the /CS signal caused by the system.

This embodiment can offer the same effects as those obtained from the first to fifth embodiments described above. Besides, in this embodiment, the cycle changing signal LONG output from the consecutive refresh judgement circuit 14 is output to the exterior through the external terminal LNG. Consequently, depending on the cycle changing signal LONG, it is possible to change the interval of refresh requests to be generated by the system that controls the DRAM which can be supplied with refresh requests even from the exterior. As a result, even if the refresh requests (refresh commands REF) are kept supplied from the exterior, the cycle time tRC can be reduced with no increase in the power consumption in standby mode.

Figure 22:
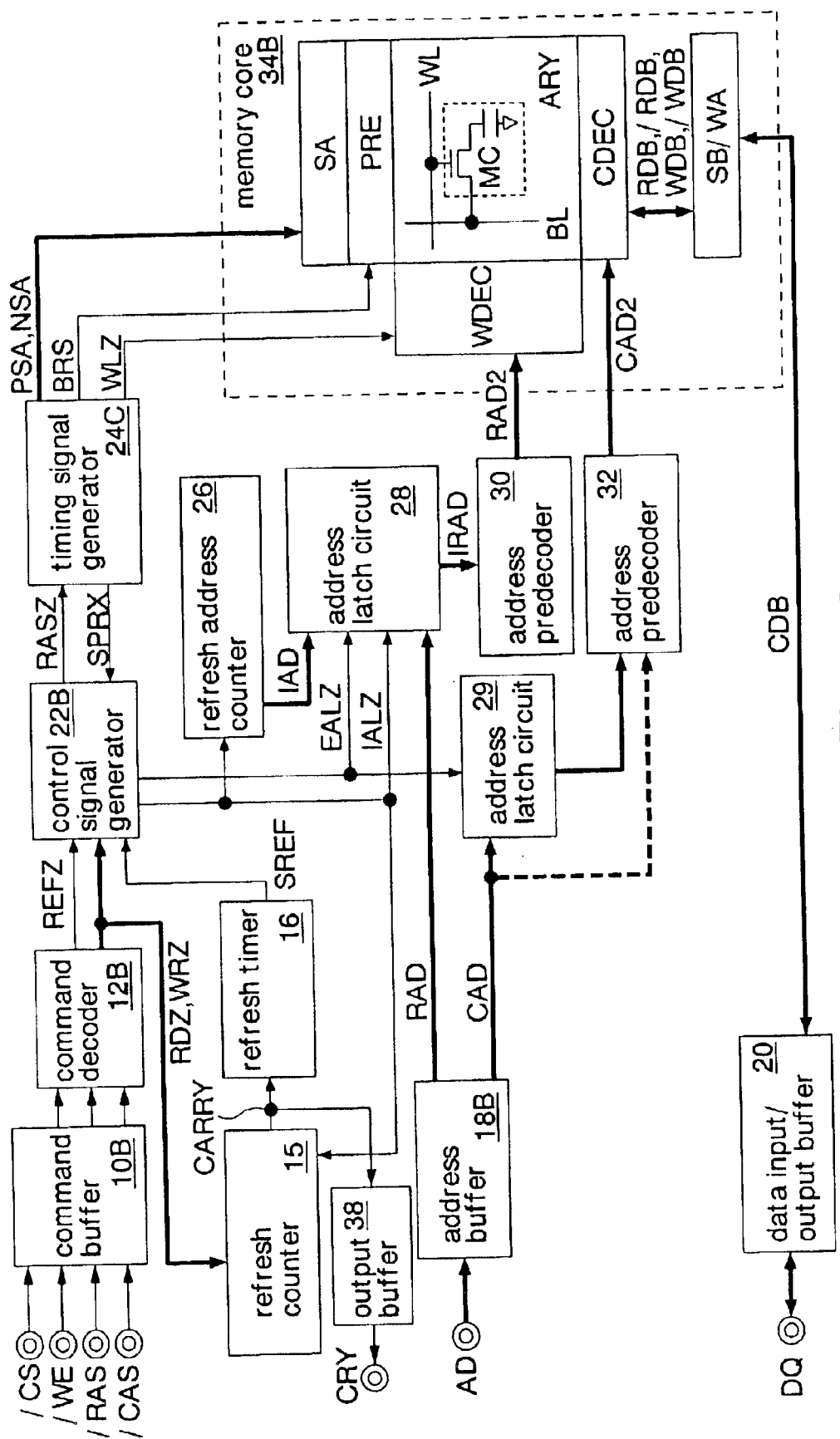
FIG. 22 is a block diagram showing a seventh embodiment of the semiconductor memory of the present invention.

FIG. 22 shows a seventh embodiment of the semiconductor memory of the present invention. The same elements as those described in the first to sixth embodiments will be designated by identical reference numbers or symbols. Detailed description thereof will be omitted here.

This embodiment is formed by adding the output buffer 38 to the fifth embodiment. The rest of the configuration is the same as in the fifth embodiment. That is, the semiconductor memory is formed as a DRAM having a self refresh function, by using CMOS technology.

The output buffer 38 receives the carryover signal CARRY output from the refresh counter 15, and outputs the received signal to an external terminal CRY. That is, in this embodiment, notification that the refresh counter 15 goes through a single round is given to the exterior.

Figure 23:
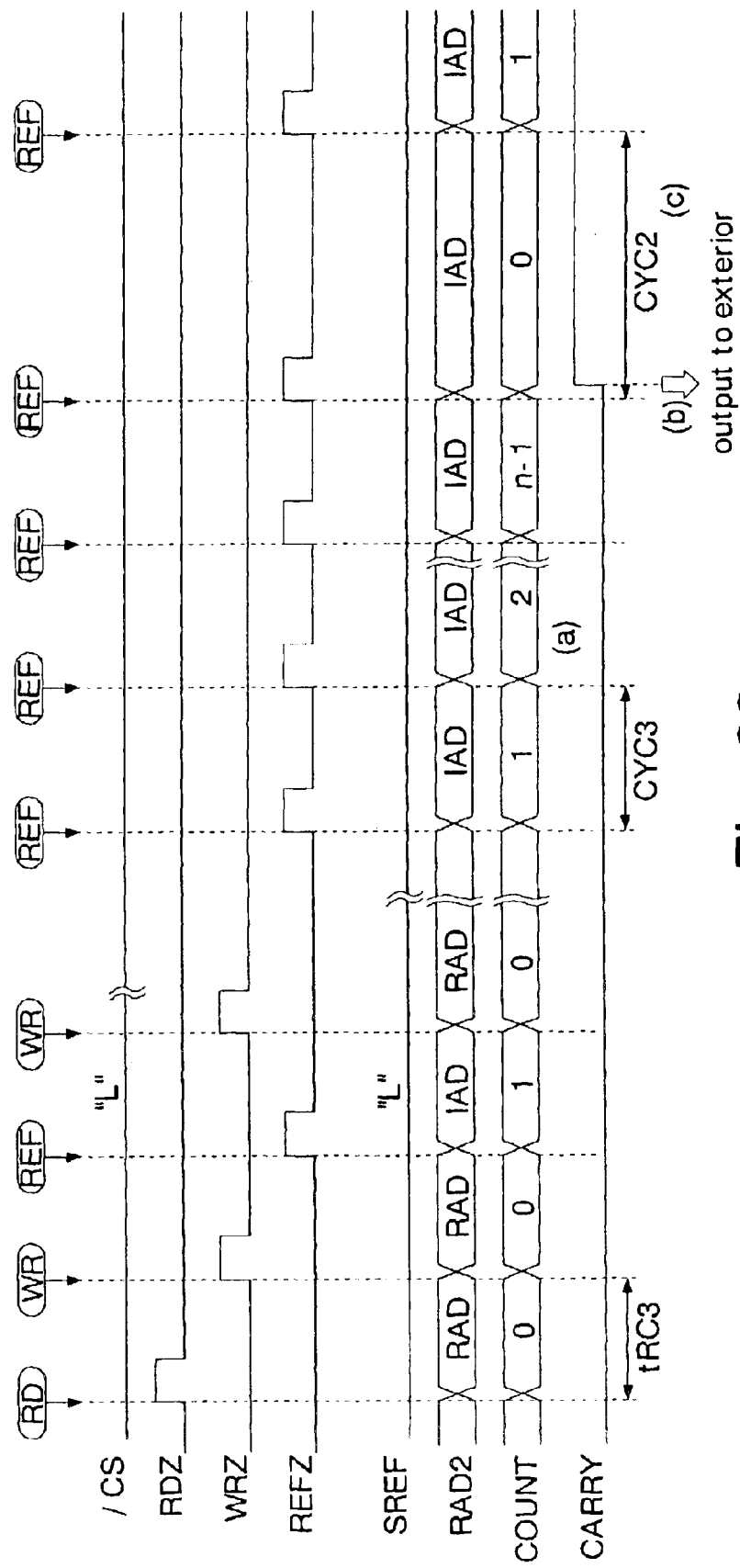
FIG. 23 is a timing chart showing the operation of the semiconductor memory of the seventh embodiment.

FIG. 23 shows the operation of the semiconductor memory of the seventh embodiment. Description will be omitted of the same operation as in the fifth embodiment (FIG. 19).

In this example, a read command RD, a write command WR, an external refresh command REF, and a write command WR are supplied in succession. Subsequently, external refresh commands REF are supplied in succession so that auto refresh is performed by using the refresh address counter 26. That is, the DRAM is operating in normal operation mode.

The intervals of supply of the read command RD, the write command WR, and the external refresh command REF are set at "tRC". The intervals of supply of the external refresh commands REF are set at "CYC3".

When neither the read command RD nor the write command WR is supplied but the refresh commands REF are supplied consecutively, the refresh counter 15 increments its counter value COUNT in succession (FIG. 23(a)). The counter value COUNT changes from the maximum value n−1 to "0", and the carryover signal CARRY is output. The carryover signal CARRY is output to the exterior of the DRAM through the external terminal CRY (FIG. 23(b)).

The system that controls the DRAM changes the intervals of supply of the refresh commands REF (refresh cycle) from CYC3 to CYC2 in response to the carryover signal CARRY (FIG. 23(c)). That is, after the refresh counter 15 goes through a single round, the refresh cycle is extended by the system that controls the DRAM. The extended refresh cycle reduces the standby power consumption in normal operations.

Incidentally, the DRAM has self refresh mode. Thus, the DRAM operates under the same timing as in the fifth embodiment (FIG. 19) across the high-level change of the /CS signal initiated by the system.

This embodiment can offer the same effects as those obtained from the first to sixth embodiments described above. Moreover, in this embodiment, the carryover signal CARRY output from the refresh counter 15 is output to the exterior through the external terminal CRY. Consequently, in accordance with the carryover signal CARRY, it is possible to change the interval of refresh requests to be generated by the system that controls the DRAM which can be supplied with refresh requests even from the exterior. As a result, even if the refresh requests (refresh commands REF) are kept supplied from the exterior, the cycle time tRC can be reduced with no increase in the power consumption in standby mode.

Figure 24:
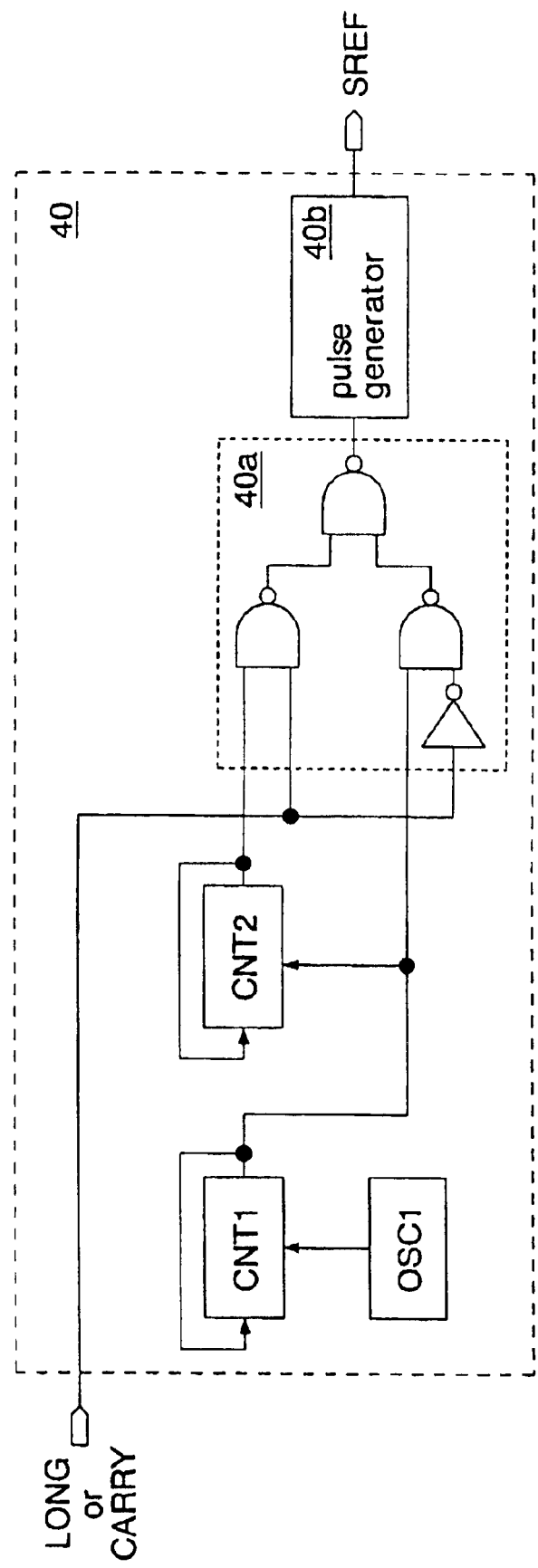
FIG. 24 is a block diagram showing another example of the refresh timer.

The embodiments described above have dealt with the cases where the refresh timer 16 is made of the circuit shown in FIG. 2. However, the present invention is not limited to such embodiments. For example, as shown in FIG. 24, a refresh timer 40 may be constituted by connecting an oscillator OSC1 and counters CNT1, CNT2 in series. In this case, the counter CNT1 can be used as the counter corresponding to a shorter refresh cycle and as a lower bit of the counter corresponding to a longer refresh cycle. As a result, the refresh timer 40 can be made smaller in layout area. In addition, a pulse generator 40b can be connected to the output of a selector 40a so that a pulsed refresh request signal SREF is generated easily.

The embodiments described above have dealt with the cases where the refresh counter 15 is reset in synchronization with the read control command RDZ and the write control command WRZ, and counts in synchronization with the internal address latch signal IALZ. However, the present invention is not limited to such embodiments. For example, the refresh counter 15 may be reset in synchronization with the external address latch signal EALZ and count in synchronization with the internal address latch signal IALZ. Alternatively, the count operation may be performed in synchronization with the refresh request signal SREF.

The third embodiment described above has dealt with the case where the activating period of the sense amplifiers SA is set at the period ACT1 in a refresh operation and at the period ACT3 in write and read operations. However, the invention is not limited to such an embodiment. For example, the activating periods of the sense amplifiers SA may be reduced in order of a refresh operation, a write operation, and a read operation. In this case, the read operating time can be further reduced for improved data transfer rate. This is particularly effective when applied to semiconductor memories in which read operations are higher than write operations in frequency.

The fourth embodiment described above has dealt with the case where the present invention is applied to a DRAM of direct sense amplifier method. However, the present invention is not limited to such an embodiment. For example, the present invention can offer the same effects even when applied to a pseudo SRAM of direct sense amplifier method.

While the present invention has been described above in detail, it is to be understood that the foregoing embodiments and modified examples thereof are given just as a few examples of the invention.

The invention is not limited to the above embodiments and various modifications may be made without departing from the spirit and scope of the invention. Any improvement may be made in part or all of the components.

What is claimed is:

1. A semiconductor memory comprising:
  a plurality of memory cells requiring refresh to retain data;
  sense amplifiers for amplifying quantity of signals in data to be written to said memory cells;
  an operation control circuit for activating said sense amplifiers in response to a read request, a write request, and a refresh request to said memory cells, and setting a timing said sense amplifiers inactivates so to correspond to a timing a maximum possible quantity of signals, which is to be amplified by said sense amplifiers operating in response to said refresh request, is transmitted to said memory cells; and
  a refresh control circuit for generating a refresh request signal as said refresh request in a first cycle which can perform read operations or write operations, and setting to a second cycle the cycle of generating said refresh request signal after a predetermined number of said refresh request is generated consecutively without intervention of said read request or said write request so that said memory cells are all refreshed, the second cycle being longer than the first cycle.

2. The semiconductor memory according to claim 1, further comprising
  a refresh address counter for generating a refresh address designating a refresh memory cell to refresh, out of said memory cells, wherein
  said refresh control circuit includes:
  a consecutive refresh judgement circuit for activating a cycle changing signal when said refresh address counter goes through a single round without the intervention of said read request or said write request; and
  a refresh timer for extending a length of the cycle for generating the refresh request signal while the cycle changing signal is activated, so that the cycle is longer than the length of a cycle while the cycle changing signal is inactivated.

3. The semiconductor memory according to claim 2, further comprising
  an external terminal for outputting said cycle changing signal, output from said refresh counter, to the exterior of the semiconductor memory.

4. The semiconductor memory according to claim 2, wherein
  said refresh control circuit inactivates said cycle changing signal when said read request or said write request occurs while the cycle of generating said refresh request signal is extended.

5. The semiconductor memory according to claim 1, wherein said refresh control circuit includes:

a refresh counter being reset in response to said read request or said write request, counting in response to said refresh request signal, and activating a cycle changing signal when its counter value reaches said predetermined number; and a refresh timer for extending a length of the cycle for generating the refresh request signal while the cycle changing signal is activated, so that the cycle is longer than the length of a cycle while the cycle changing signal is inactivated.

6. The semiconductor memory according to claim 5, further comprising an external terminal for outputting said cycle changing signal, output from said refresh counter, to the exterior of the semiconductor memory.

7. The semiconductor memory according to claim 5, wherein said refresh control circuit inactivates said cycle changing signal when said read request or said write request occurs while the cycle of generating said refresh request signal is extended.

8. The semiconductor memory according to claim 5, wherein:

said operation control circuit outputs a refresh control signal to perform a refresh operation when the operation control circuit recognizes said refresh request signal; and said refresh address counter counts said refresh control signal as said refresh request.

9. The semiconductor memory according to claim 1, further comprising a plurality of word lines connected to said memory cells, respectively, said word lines each being selected in accordance with an address signal, and wherein said operation control circuit sets selecting periods for said word lines to be equal, in a read operation corresponding to said read request, a write operation corresponding to said write request, and a refresh operation corresponding to said refresh request.

10. The semiconductor memory according to claim 1, wherein:

said refresh request is recognized only by said refresh request signal output from said refresh control circuit; and a refresh operation is performed on said memory cells only in response to said refresh request signal, without receiving a command signal from an external terminal.

11. The semiconductor memory according to claim 1, further comprising a plurality of word lines connected to said memory cells, respectively, said word lines being selected in accordance with an address signal, and wherein said operation control circuit sets a selecting period for said word lines in one of a read operation corresponding to said read request, and a write operation corresponding to said write request, to be shorter than the selecting period for said word lines in a refresh operation corresponding to said refresh request.

12. The semiconductor memory according to claim 11, wherein said operation control circuit sets a timing for said word lines to be deselected during at least one of said read operation and said write operation, to be earlier than the timing for said word lines to be deselected during said refresh operation.

13. The semiconductor memory according to claim 1, wherein said operation control circuit sets an activating period for said sense amplifiers in one of a read operation corresponding to said read request, and a write operation corresponding to said write request, to be shorter than the activating period for said sense amplifiers in a refresh operation corresponding to said refresh request.

14. The semiconductor memory according to claim 13, wherein said operation control circuit sets a timing for said sense amplifiers to be inactivated during at least one of said read operation and said write operation, to be earlier than the timing for said sense amplifiers to be inactivated during said refresh operation.

15. The semiconductor memory according to claim 1, wherein said operation control circuit recognizes said refresh request when the refresh request signal is output from said refresh control circuit or when a refresh command is supplied through an external terminal.

16. The semiconductor memory according to claim 1, wherein:

said operation control circuit outputs a sense amplifier activating signal for activating said sense amplifiers in response to said read request, said write request, and said refresh request;

said sense amplifiers are connected to a power supply line in response to said sense amplifier activating signal; and said maximum possible quantity of signals to be amplified by said sense amplifiers is a quantity corresponding to a power supply voltage of said power supply line.

17. The semiconductor memory according to claim 1, further comprising:

a memory cell array composed of said memory cells and being divided into a plurality of refresh areas each being a single refresh unit, wherein said predetermined number is equal to the number of said refresh areas.

18. The semiconductor memory according to claim 17, further comprising a plurality of word lines connected to said memory cells, respectively, said word lines each being selected in accordance with an address signal, and wherein said refresh areas are formed in correspondence with said word lines, respectively.

19. The semiconductor memory according to claim 1, further comprising a plurality of bit lines for connecting said memory cells to said sense amplifiers, respectively, and wherein said sense amplifiers amplify quantity of signals in data transmitted onto said bit lines, respectively.

* * * * *